US009312311B2

(12) United States Patent
Im et al.

(10) Patent No.: US 9,312,311 B2
(45) Date of Patent: Apr. 12, 2016

(54) ORGANIC LUMINESCENCE DISPLAY AND METHOD OF MANUFACTURING THE SAME

(71) Applicant: Samsung Display Co., Ltd., Yongin, Gyeonggi-Do (KR)

(72) Inventors: Choong Youl Im, Yongin-Si (KR); Il Jung Lee, Yongin-si (KR); Do Hyun Kwon, Yongin-si (KR); Ju Won Yoon, Yongin-si (KR); Moo-Soon Ko, Yongin-si (KR); Min Woo Woo, Yongin-si (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 106 days.

(21) Appl. No.: 14/133,218

(22) Filed: Dec. 18, 2013

(65) Prior Publication Data
US 2014/0306198 A1  Oct. 16, 2014

(30) Foreign Application Priority Data

Apr. 15, 2013  (KR) .................... 10-2013-0041077

(51) Int. Cl.
 *H01L 51/56*  (2006.01)
 *H01L 27/32*  (2006.01)
 *H01L 51/00*  (2006.01)
(52) U.S. Cl.
 CPC ........ *H01L 27/3216* (2013.01); *H01L 51/0013* (2013.01); *H01L 27/3218* (2013.01)
(58) Field of Classification Search
 CPC ............ H01L 27/3211; H01L 27/3216; H01L 27/3218; H01L 51/0013
 See application file for complete search history.

(56) References Cited

U.S. PATENT DOCUMENTS

| 8,258,691 | B2 * | 9/2012 | Lee | H01L 27/3206 313/504 |
| 8,330,352 | B2 * | 12/2012 | Sung | H01L 27/3216 313/504 |
| 8,395,308 | B2 * | 3/2013 | Asaki | H01L 27/3211 313/483 |
| 2004/0017152 | A1 * | 1/2004 | Hashimoto | H01L 27/3246 313/505 |
| 2009/0284128 | A1 * | 11/2009 | Shinohara | H01L 27/3211 313/498 |
| 2010/0117528 | A1 * | 5/2010 | Fukuda | H01L 51/5284 313/505 |
| 2011/0261019 | A1 * | 10/2011 | Makita | H01L 27/12 345/175 |
| 2013/0161679 | A1 * | 6/2013 | Kondo | H01L 51/5206 257/98 |

FOREIGN PATENT DOCUMENTS

| KR | 1020050061410 A | 6/2005 |
| KR | 1020070031914 A | 3/2007 |
| KR | 1020080047777 A | 5/2008 |

* cited by examiner

*Primary Examiner* — Mohsen Ahmadi
*Assistant Examiner* — Stephen Bradley
(74) *Attorney, Agent, or Firm* — Robert E. Bushnell, Esq.

(57) ABSTRACT

Provided are organic luminescence display and method for manufacturing the same. According to an aspect of the present invention, there is provided an organic luminescence display comprising a substrate and a plurality of pixels disposed on the substrate. The pixels comprise a plurality of first pixels, each comprising a first organic light-emitting layer, and a plurality of second pixels which are smaller than the first pixels and each of which comprises a second organic light-emitting layer. The surface roughness of the second organic light-emitting layer is greater than the surface roughness of the first organic light-emitting layer.

24 Claims, 22 Drawing Sheets

FIG. 3
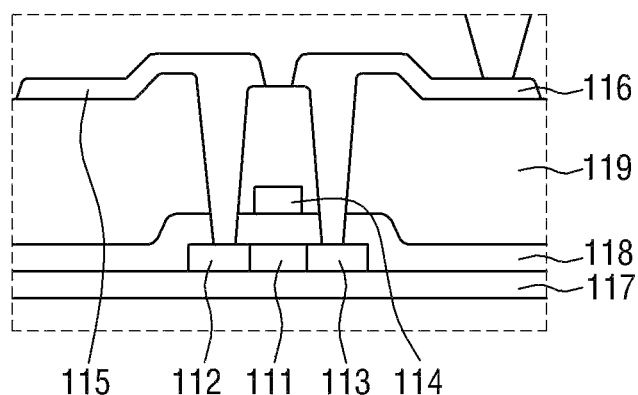
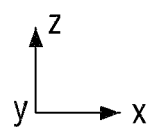

FIG. 14
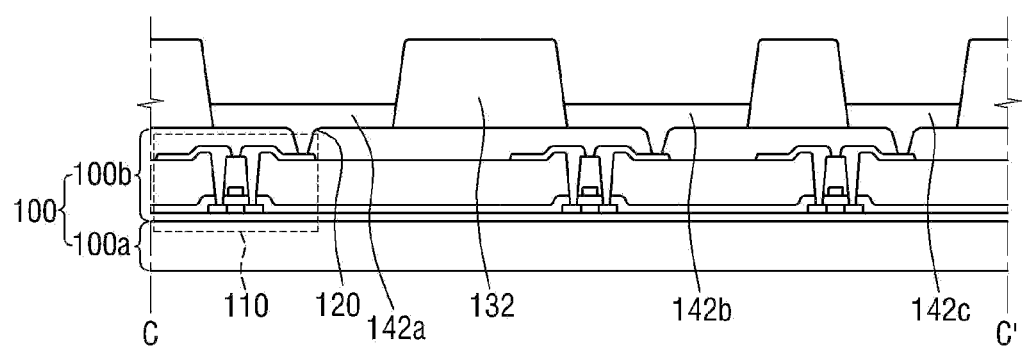
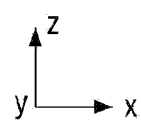

ORGANIC LUMINESCENCE DISPLAY AND METHOD OF MANUFACTURING THE SAME

CLAIM OF PRIORITY

This application makes reference to, incorporates into this specification the entire contents of, and claims all benefits accruing under 35 U.S.C. §119 from an application earlier filed in the Korean Intellectual Property Office on Apr. 15, 2013, and there duly assigned Serial No. 10-2013-0041077.

BACKGROUND OF THE INVENTION

1. Field of the Invention

The present invention relates to an organic luminescence display and a method of manufacturing the same, and more particularly, to an organic luminescence display which includes an organic light-emitting layer of a large pixel formed by a deposition process and an organic light-emitting layer of a small pixel formed by a transfer process and a method of manufacturing the same.

2. Description of the Related Art

Generally, an organic luminescence display includes a pixel electrode, a common electrode, and organic layers interposed between the pixel electrode and the common electrode. The organic layers include at least an emitting layer (EML) and may further include a hole injecting layer (HIL), a hole transport layer (HTL), an electron transport layer (ETL) and an electron injecting layer (EIL). In the organic luminescence display, holes and electrons generated by the pixel electrode and the common electrode may combine in an organic layer, particularly, in the EML to form excitons. When an energy level of the excitons changes from an excited state to a ground state, the EML may emit light of a color corresponding to the changed energy level.

In order to realize a full-color organic luminescence display, it is required to pattern the above organic layer. To pattern the organic layer, a deposition method using a fine metal mask (FMM) or a transfer method (i.e., a laser induced thermal imaging (LITI) method) using a laser may be utilized. The deposition method using the FMM is a contemporary method that has been used and ensures high efficiency and stability. With the transfer method using the laser, fine patterns can be formed easily.

Recently, the size of a pattern into which the organic layer is patterned has been reduced in order to obtain a high-resolution organic luminescence display. Accordingly, it has become difficult to manufacture an FMM including an opening that corresponds to the pattern. Even if the FMM can be manufactured, the opening of the FMM may be clogged immediately after the initiation of a deposition process.

SUMMARY OF THE INVENTION

Aspects of the present invention provide a high-quality organic luminescence display which includes an organic light-emitting layer of a large pixel formed by a deposition process and an organic light-emitting layer of a small pixel formed by a transfer process.

Aspects of the present invention also provide a method of manufacturing an organic luminescence display, in which an organic light-emitting layer of a large pixel is formed by a deposition process, and an organic light-emitting layer of a small pixel is formed by a transfer process.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic luminescence display comprising a substrate and a plurality of pixels disposed on the substrate. The pixels may be constructed with a plurality of first pixels, each comprising a first organic light-emitting layer, and a plurality of second pixels which are smaller than the first pixels and each of which comprises a second organic light-emitting layer. The surface roughness of the second organic light-emitting layer is greater than the surface roughness of the first organic light-emitting layer.

According to another aspect of the present invention, there is provided an organic luminescence display may be constructed with a substrate and a plurality of pixels disposed on the substrate. The pixels may be constructed with a plurality of first pixels, each comprising a first organic light-emitting layer, a plurality of second pixels, each comprising a second organic light-emitting layer, and a plurality of third pixels, each comprising a third organic light-emitting layer. The surface roughness of the first organic light-emitting layer is equal to the surface roughness of the second organic light-emitting layer, and the surface roughness of the third organic light-emitting layer is greater than the surface roughness of the first organic light-emitting layer.

According to still another aspect of the present invention, there is provided a method of manufacturing an organic luminescence display. The method may be practiced by forming a first organic light-emitting layer by depositing a first organic light-emitting material on a first pixel electrode which is disposed on a substrate and exposed by a pixel defining layer, and forming a second organic light-emitting layer by transferring a transfer layer containing a second organic light-emitting material onto a second pixel electrode which is disposed on the substrate and exposed by the pixel defining layer. A minimum width of the second pixel electrode exposed by the pixel defining layer is smaller than a minimum width of the first pixel electrode exposed by the pixel defining layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein:

FIG. 3 is an enlarged cross-sectional view of a pixel driver shown in FIG. 2;

FIG. 14 is a cross-sectional view illustrating an operation of preparing a substrate having a plurality of pixel electrodes and a pixel defining layer in a method of manufacturing the organic luminescence display of FIG. 12;

DETAILED DESCRIPTION OF THE INVENTION

Figure 1:
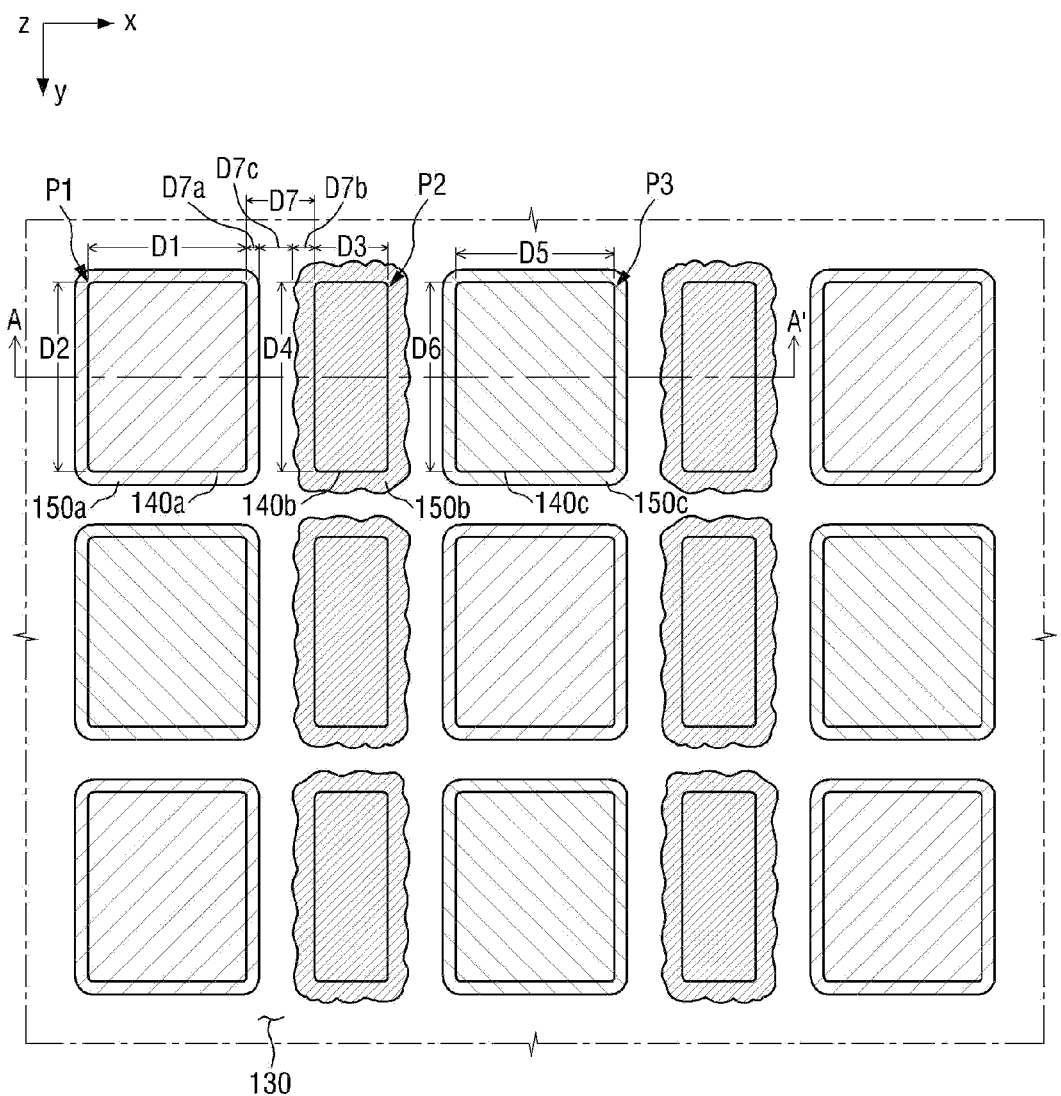
FIG. 1 is a plan view schematically illustrating an arrangement of pixels of an organic luminescence display constructed as an embodiment according to the principles of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Hereinafter, embodiments of the present invention will be described with reference to the attached drawings.

Figure 2:
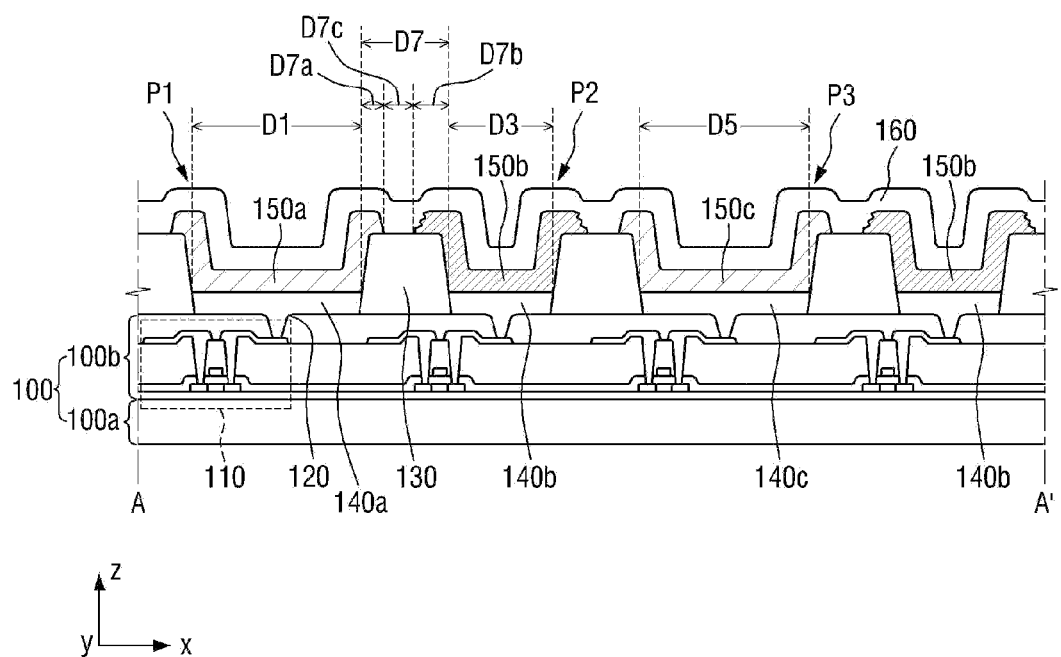
FIG. 2 is a cross-sectional view taken along line A-A' of FIG. 1.

FIG. 1 is a plan view schematically illustrating the pixel arrangement of an organic luminescence display constructed as an embodiment according to the principles of the present invention. FIG. 2 is a cross-sectional view taken along line A-A' of FIG. 1. FIG. 3 is an enlarged cross-sectional view of a pixel driver shown in FIG. 2.

Referring to FIGS. 1 through 3, the organic luminescence display according to the current embodiment may include a substrate 100, a pixel defining layer 130, a plurality of pixel electrodes (140a, 140b, 140c), a plurality of organic light-emitting layers (150a, 150b, 150c), and a common electrode 160.

The substrate 100 may include an insulating substrate 100a and a driver layer 100b disposed on the insulating substrate 100a.

The insulating substrate 100a may be a transparent insulating substrate formed of glass, quartz, ceramic, plastic, etc. The insulating substrate 100a may be shaped like a flat plate or may be a flexible substrate that can be easily bent by an external force.

The driver layer 100b may be disposed on the insulating substrate 100a and may include a pixel driver 110 for driving the organic luminescence display and various wirings such as data lines. The driver layer 100b may consist of a single layer or multiple layers.

The pixel driver 110 may be connected to any one of a first pixel electrode 140a, a second pixel electrode 140b, and a third pixel electrode 140c via a through hole 120. The pixel driver 110 may control an electric current supplied to the first pixel electrode 140a, the second pixel electrode 140b or the third pixel electrode 140c which is connected to the pixel driver 110.

More specifically, referring to FIG. 3, the pixel driver 110 may include a buffer layer 117, a semiconductor layer (111, 112, 113), a gate insulating layer 118, an interlayer insulating film 119, a gate electrode 114, a source electrode 115, and a drain electrode 116.

The buffer layer 117 may be formed of various materials that can prevent the penetration of impurity elements and planarize the surface of the substrate 110. In an exemplary embodiment, the buffer layer 117 may be formed of any one of silicon nitride ($SiN_x$), silicon oxide ($SiO_2$), and silicon oxynitride ($SiO_xN_y$). However, the buffer layer 117 is optional and can be omitted depending on the type of the substrate 100 and process conditions.

The semiconductor layer (111, 112, 113) may be formed on the buffer layer 117. The semiconductor layer (111, 112, 113) may be formed of amorphous semiconductor or polycrystalline semiconductor. Preferably, the semiconductor layer (111, 112, 113) may be formed of polycrystalline semiconductor. The semiconductor layer (111, 112, 113) may also be formed of oxide semiconductor. The semiconductor layer (111, 112, 113) includes a channel region 111 undoped with impurities and p+-doped source and drain regions 112 and 113 disposed on both sides of the channel region 111. Here, an ion material used to dope the semiconductor layer (111, 112, 113) may be boron (B)-containing P-type impurities such as $B_2H_6$. The impurities used to dope the semiconductor layer (111, 112, 113) may vary according to the type of a thin-film transistor (TFT).

The gate insulating layer 118 may be formed on the semiconductor layer (111, 112, 113). The gate insulating layer 118 may be formed of $SiN_x$ or $SiO_2$.

The interlayer insulating film 119 may be formed on the gate insulating layer 118. The interlayer insulating film 119 may cover the gate electrode 114. The gate insulating layer 118 and the interlayer insulating film 119 may share holes that expose the source region 112 and the drain region 113 of the semiconductor layer (111, 112, 113). Like the gate insulating layer 118, the interlayer insulating film 119 may be formed of $SiN_x$ or $SiO_2$.

The gate electrode 114 may be formed on the gate insulating film 118. The gate electrode 114 may be included in a gate wiring. The gate wiring may further include a gate line (not shown) and other wiring lines. The gate electrode 114 may overlap at least part of the semiconductor layer (111, 112, 113). In an exemplary embodiment, the gate electrode 114 may overlap the channel region 111.

The source electrode 115 and the drain electrode 116 may be formed on the interlayer insulating film 119. The source electrode 115 and the drain electrode 116 may be included in a data wiring. The data wiring may include a data line (not shown), a common power supply line (not shown) and other wiring lines. The source electrode 115 and the drain electrode 116 may be connected to the source region 112 and the drain region 113 of the semiconductor layer (111, 112, 113) via the holes, respectively.

The pixel defining layer 130 may be formed on the driver layer 100b. The pixel defining layer 130 may be formed of an organic insulating material or an inorganic insulating material. The pixel defining layer 130 may also be formed of a photosensitizer that contains black pigments. In this case, the pixel defining layer 130 may function as a light blocking member. The pixel defining layer 130 may include a plurality of opening regions arranged in a matrix.

The pixel electrodes (140a, 140b, 140c) may be disposed on the substrate 100. The pixel electrodes (140a, 140b, 140c) may be located in the opening regions defined by the pixel defining layer 130. The pixel electrodes (140a, 140b, 140c) may include the first pixel electrode 140a, the second pixel electrode 140b, and the third pixel electrode 140c. Each of the first pixel electrode 140a, the second pixel electrode 140b, and the third pixel electrode 140c may be connected to the drain electrode 116 of the pixel driver 110 via the through hole 120.

The pixel electrodes (140a, 140b, 140c) may be formed of a reflective conductive material, a transparent conductive material, or a semi-transparent conductive material. The reflective conductive material may be lithium (Li), calcium (Ca), lithium fluoride/calcium (LiF/Ca), lithium fluoride/aluminum (LiF/Al), aluminum (Al), silver (Ag), magnesium (Mg), or gold (Au). The transparent conductive material may be indium tin oxide (ITO), indium zinc oxide (IZO), zinc oxide (ZnO), or indium oxide ($In_2O_3$). Also, the semi-transparent conductive material may be a co-deposition material containing one or more of Mg and Ag or may be one or more of Mg, Ag, Ca, Li, and Al. The pixel electrodes (140a, 140b, 140c) may consist of multiple layers and may exhibit reflective, transparent, or semi-transparent characteristics depending on the stacked structure of the multiple layers.

The organic light-emitting layers (150a, 150b, 150c) may be formed on the pixel electrodes (140a, 140b, 140c). In an exemplary embodiment, a middle portion of one organic light-emitting layer may contact one pixel electrode, and edge portions of the organic light-emitting layer may contact portions of the pixel defining layer 130 which are adjacent to the one pixel electrode.

The organic light-emitting layers (150a, 150b, 150c) may include a first organic light-emitting layer 150a, a second organic light-emitting layer 150b, and a third organic light-emitting layer 150c. The first organic light-emitting layer 150a may be disposed on the first pixel electrode 140a, the second organic light-emitting layer 150b may be disposed on the second pixel electrode 140b, and the third organic light-emitting layer 150c may be disposed on the third pixel electrode 140c.

The organic light-emitting layers (150a, 150b, 150c), that is, the first organic light-emitting layer 150a, the second organic light-emitting layer 150b, and the third organic light-emitting layer 150c may be formed of different materials. However, the present invention is not limited thereto, and at least two of the first organic light-emitting layer 150a, the second organic light-emitting layer 150b, and the third organic light-emitting layer 150c may be formed of the same material. In addition, the first organic light-emitting layer 150a, the second organic light-emitting layer 150b, and the third organic light-emitting layer 150c may have the same stacked structure. However, the present invention is not limited thereto, and at least one of the first organic light-emitting layer 150a, the second organic light-emitting layer 150b, and the third organic light-emitting layer 150c may have a different stacked structure.

Holes and electrons generated by the pixel electrodes (140a, 140b, 140c) and the common electrode 160 may combine in the organic light-emitting layers (150a, 150b, 150c). When an energy level of excitons formed by the combination of the holes and the electrons changes from an excited state to a ground state, light of a color corresponding to the changed energy level may be emitted. In an exemplary embodiment, the first organic light-emitting layer 150a, the second organic light-emitting layer 150b, and the third organic light-emitting layer 150c may emit light of different colors. However, the present invention is not limited thereto, and at least two of the first organic light-emitting layer 150a, the second organic light-emitting layer 150b, and the third organic light-emitting layer 150c may emit light of the same color. In the exemplary embodiment of FIGS. 1 and 2, the first organic light-emitting layer 150a may emit red light, the second organic light-emitting layer 150b may emit green light, and the third organic light-emitting layer 150c may emit blue light. In another exemplary embodiment, the first organic light-emitting layer 150a may emit red light, the second organic light-emitting layer 150b may emit blue light, and the third organic light-emitting layer 150c may emit green light.

Although not shown in the drawings, in some embodiments of the present invention, a hole transport layer may further be formed between the first organic light-emitting layer 150a and the first pixel electrode 140a, between the second organic light-emitting layer 150b and the second pixel electrode 140b, and between the third organic light-emitting layer 150c and the third pixel electrode 140c. In addition, a hole injecting layer may further be formed between the hole transport layer and each of the first pixel electrode 140a, the second pixel electrode 140b and the third pixel electrode 140c. Although not shown in the drawings, in some embodiments of the present invention, an electron transport layer may further be formed between the common electrode 160 and each of the first organic light-emitting layer 150a, the second organic light-emitting layer 150b and the third organic light-emitting layer 150c, and an electron injecting layer may further be formed between the electron transport layer and the common electrode 160.

The common electrode 160 may be formed on the organic light-emitting layers (150a, 150b, 150c). An electric potential applied to the common electrode 160 may create a potential difference between the common electrode 160 and the first pixel electrode 140a, the second pixel electrode 140b or the third pixel electrode 140c.

The common electrode 160 may be formed of a reflective conductive material, a transparent conductive material, or a semi-transparent conductive material. The reflective conductive material may be Li, Ca, LiF/Ca, LiF/Al, Al, Ag, Mg, or Au. The transparent conductive material may be ITO, IZO, ZnO, or $In_2O_3$. Also, the semi-transparent conductive material may be a co-deposition material containing one or more of Mg and Ag or may be one or more of Mg, Ag, Ca, Li, and Al.

Although not shown in the drawings, an encapsulating layer may be formed on the common electrode 160. The encapsulating layer may be disposed on the common electrode 160 to face the substrate 100 and seals the first organic light-emitting layer 150a, the second organic light-emitting layer 150b, and the third organic light-emitting layer 150c between itself and the substrate 100 from the outside environment. Accordingly, the present invention may further include a sealing member (not shown) used to bond and seal the substrate 100 and the encapsulating layer. The sealing member (not shown) may be formed of one or more materials selected from the group consisting of acrylic resin, methacrylic resin, polyisoprene, vinyl resin, epoxy resin, urethane resin, and cellulose resin.

A plurality of pixels (P1, P2, P3) of the organic luminescence display according to the current embodiment will now be described with reference to FIGS. 1 and 2 again.

The organic luminescence display according to the current embodiment may include a plurality of pixels (P1, P2, P3) disposed on the substrate 100. Specifically, the pixels (P1, P2, P3) may be located in the opening regions of the pixel defining layer 130. That is, the pixels (P1, P2, P3) may be separated from each other by the pixel defining layer 130.

Each of the pixels (P1, P2, P3) may include one organic light-emitting layer which overlaps one pixel electrode. In addition, each of the pixels (P1, P2, P3) may further include the one pixel electrode and the common electrode 160 which overlaps the one pixel electrode.

The pixels (P1, P2, P3) may include a plurality of first pixels P1, a plurality of second pixels P2, and a plurality of third pixels P3.

Referring to FIG. 1, the first pixels P1, the second pixels P2, and the third pixels P3 may be quadrangular. Each of the first pixels P1 may be shaped like a quadrangle including short sides having a length of D1 and long sides having a length of D2, each of the second pixels P2 may be shaped like a quadrangle including short sides having a length of D3 and long sides having a length of D4, and each of the third pixels P3 may be shaped like a quadrangle including short sides having a length of D5 and long sides having a length of D6. That is, each of the first pixels P1 may be formed in a region of D1×D2, each of the second pixels P2 may be formed in a region of D3×D4, and each of the third pixels P3 may be formed in a region of D5×D6. While the first pixels P1, the second pixels P2 and the third pixels P3 may be quadrangular as described above, their shape is not limited to the quadrangular shape. That is, the first pixels P1, the second pixels P2 and the third pixels P3 may also be circular, ellipsoidal, or polygonal. In addition, at least one of the first through third pixels P1 through P3 may have a different shape from that of the other pixels.

Referring to FIG. 2, each of the first pixels P1 may include the first organic light emitting layer 150a which overlaps the first pixel electrode 140a, each of the second pixels P2 may include the second organic light-emitting layer 150b which overlaps the second pixel electrode 140b, and each of the third pixels P3 may include the third organic light-emitting layer 150c which overlaps the third pixel electrode 140c. In addition, each of the first pixels P1 may further include the first pixel electrode 140a and the common electrode 160 which overlaps the first pixel electrode 140a, each of the second pixels P2 may further include the second pixel electrode 140b and the common electrode 160 which overlaps the second pixel electrode 140b, and each of the third pixels P3 may further include the third pixel electrode 140c and the common electrode 160 which overlaps the third pixel electrode 140c. Each of the first through third pixels P1 through P3 may further include a power supply unit (not shown) which applies an electric potential to the common electrode 160 and a corresponding one of the first pixel electrode 140a, the second pixel electrode 140b and the third pixel electrode 140c.

The first through third pixels P1 through P3 may emit light of different colors. However, the present invention is not limited thereto, and at least two of the first through third pixels P1 through P3 may emit light of the same color. In an exemplary embodiment, the first pixels P1 may emit red light, the second pixels P2 may emit green light, and the third pixels P3 may emit blue light. In another exemplary embodiment, the first pixels P1 may emit red light, the second pixels P2 may emit blue light, and the third pixels P3 may emit green light.

The pixel arrangement of the organic luminescence display according to the current embodiment will now be described with reference to FIG. 1.

The first pixels P1 and the second pixels P2 may be arranged adjacent to each other. In the exemplary embodiment of FIG. 1, the first pixels P1 and the second pixels P2 may be arranged side by side. The order in which the first pixels P1 and the second pixels P2 are arranged can be reversed. That is, the first pixels P1 and the second pixels P2 may be arranged in the order of the first pixel P1 and the second pixel P2 in an x direction or in the order of the second pixel P2 and the first pixel P1 in the x direction.

The second pixels P2 and the third pixels P3 may also be arranged adjacent to each other. In the exemplary embodiment of FIG. 1, the second pixels P2 and the third pixels P3 may be arranged side by side. The order in which the second pixels P2 and the third pixels P3 are arranged can be reversed. That is, the second pixels P2 and the third pixels P3 may be arranged in the order of the second pixel P2 and the third pixel P3 in the x direction or in the order of the third pixel P3 and the second pixel P2 in the x direction.

The first pixels P1 and the third pixels P3 may also be arranged adjacent to each other. However, a direction in which the first pixels P1 and the third pixels P3 are arranged may be perpendicular to a direction in which the first pixels P1 and the second pixels P2 are arranged or a direction in which the second pixels P2 and the third pixels P3 are arranged. In the exemplary embodiment of FIG. 1, the first pixels P1 and the third pixels P3 may be arranged side by side in a y direction.

Each of the first pixels P1 may be disposed between two second pixels P2. In the exemplary embodiment of FIG. 1, the second pixels P2 may be disposed on both sides of each of the first pixels P1, that is, on a side of each of the first pixels P1 in the x direction and the other side of each of the first pixels P1 in a −x direction.

Each of the third pixels P3 may also be disposed between two second pixels P2. In the exemplary embodiment of FIG. 1, the second pixels P2 may be disposed on both sides of each of the third pixels P3, that is, on a side of each of the third pixels P3 in the x direction and the other side of each of the third pixels P3 in the −x direction.

Each of the second pixels P2 may be disposed between a first pixel P1 and a third pixel P3. In the exemplary embodiment of FIG. 1, a first pixel P1 may be disposed on a first side of each of the second pixels P2, and a third pixel P3 may be disposed on a second side of each of the second pixels P2 which is opposite the first side. Here, the first side of each of the second pixels P2 may be a side thereof in the x direction or the −x direction.

The first through third pixels P1 through P3 may be separated from each other by a predetermined distance. In the exemplary embodiment of FIG. 1, the first pixels P1 and the second pixels P2 may be separated from each other by a distance of D7. Although not shown in FIG. 1, the second pixels P2 and the third pixels P3 may also be separated from each other by the distance of D7, and the first pixels P1 and the third pixels P3 may also be separated from each other by the distance of D7. However, this is merely an example, and the distance between the first pixels P1 and the second pixels P2, the distance between the second pixels P2 and the third pixels P3, and the distance between the first pixels P1 and the third pixels P3 may be different.

The first through third pixels P1 through P3 may be arranged in a matrix. In the exemplary embodiment of FIG. 1, a row direction may be the x direction, and a column direction may be the y direction. An $n^{th}$ column of the pixels (P1, P2, P3) may include the first pixels P1 and the third pixels P3 arranged alternately, an $(n+1)^{th}$ column adjacent to the $n^{th}$ column may include the second pixels P2, and an $(n+2)^{th}$ column adjacent to the $(n+1)^{th}$ column may include the first pixels P1 and the third pixels P3 arranged alternately, and an $(n+3)^{th}$ column adjacent to the $(n+2)^{th}$ column may include the second pixels P2. In the same row, any one of the first and third pixels P1 and P3 may be disposed in the $n^{th}$ column, and the other one of the first and third pixels P1 and P3 may be disposed in the $(n+2)^{th}$ column. Here, n is a natural number, i.e., an integer greater than zero, and one pixel may be formed at an intersection of one row and one column.

The $n^{th}$ column, the $(n+1)^{th}$ column, the $(n+2)^{th}$ column and the $(n+3)^{th}$ column may be parallel to one another. In addition, the $n^{th}$ column may include the first and third pixels P1 and P3 arranged alternately, and the $(n+2)^{th}$ column may include the first and third pixels P1 and P3 arranged in an opposite order to that of the $n^{th}$ column. In the $(n+1)^{th}$ column and the $(n+3)^{th}$ column, the second pixels P2 may be repeatedly arranged. That is, in the $(n+1)^{th}$ column and the $(n+3)^{th}$ column, each of the second pixels P2 may be adjacent to other second pixels P2 on both sides in the column direction.

Each of the first pixels P1 may be adjacent to the second pixels P2 in the row direction and may be adjacent to the third pixels P3 in the column direction. Each of the second pixels P2 may be adjacent to a first pixel P1 and a third pixel P3 in the row direction and may be adjacent to other second pixels P2 in the column direction. Each of the third pixels P3 may be adjacent to the second pixels P2 in the row direction and may be adjacent to the first pixels P1 in the column direction.

The pixel arrangement may be a repetition of the $n^{th}$ column, the $(n+1)^{th}$ column, the $(n+2)^{th}$ column, and the $(n+3)^{th}$ column in this order in the row direction.

The pixels (P1, P2, P3) of the organic luminescence display according to the current embodiment will now be compared with reference to FIGS. 1 and 2.

First, the first pixels P1 may be larger in size than the second pixels P2. Here, the size of each of the first pixels P1 may be the area of the region in which each of the first pixels P1 is located as seen in a plan view, and the size of each of the second pixels P2 may be the area of the region in which each of the second pixels P2 is located as seen in a plan view. Specifically, referring to FIG. 1, the size of each of the first pixels P1 may be D1×D2, and the size of each of the second pixels P2 may be D3×D4. Here, the length of D2 may be equal to the length of D4. However, since the length of D1 may be two to four times the length of D3, the size of each of the first pixels P1 may be two to four times the size of each of the second pixels P2.

The first pixels P1 may be dot-shaped, and the second pixels P2 may be stripe-shaped. Here, both the dot shape and the stripe shape may be quadrangles. However, a value obtained by dividing a length of short sides of the dot shape by a length of long sides of the dot shape may be two to four times a value obtained by dividing a length of short sides of the stripe shape by a length of long sides of the stripe shape. That is, a ratio of the length of the short sides to the length of the long sides of the dot shape may be 1:1-2, and a ratio of the length of the short sides to the length of the long sides of the stripe shape may be 1:2.5-4. That is, the dot shape and the stripe shape may be distinguished from each other by the differences in the relative lengths of their short sides and long sides.

The length of the long sides of each of the first pixels P1 may be equal to the length of the long sides of each of the second pixels P2, and the length of the short sides of each of the first pixels P1 may be greater than the length of the short sides of each of the second pixels P2. Specifically, referring to FIG. 1, the length D2 of the long sides of each of the first pixels P1 may be equal to the length D4 of the long sides of each of the second pixels P2. However, the length D1 of the short sides of each of the first pixels P1 may be two to four times the length D3 of the short sides of each of the second pixels P2. Here, the length D3 of the short sides of each of the second pixels P2 may be 1 to 10 μm, preferably, 3 to 7 μm.

A minimum width of each of the first pixels P1 may be equal to or greater than a first width, and a minimum width of each of the second pixels P2 may be equal to or smaller than a second width which is smaller than the first width. The minimum width of each of the first pixels P1 may be a shortest distance across each of the first pixels P1 as seen in a plan view, and the minimum width of each of the second pixels P2 may be a shortest distance across each of the second pixels P2 as seen in a plan view. In addition, the first width may be two to four times the second width. Specifically, the first width may be greater than 10 μm, and the second width may be 1 to 10 μm.

The size of each of the third pixels P3 may be equal to the size of each of the first pixels P1. Here, the size of each of the third pixels P3 may be the area of the region in which each of the third pixels P3 is located as seen in a plan view. Specifically, referring to FIG. 1, the size of each of the third pixels P3 may be D5×D6. Here, the length of D6 may be equal to the length of D2 and the length of D4. However, since the length of D5 may be two to four times the length of D3, the size of each of the third pixels P3 may be two to four times the size of each of the second pixels P2.

The surface roughness of the second organic light-emitting layer 150b included in each of the second pixels P2 may be greater than the surface roughness of the first organic light-emitting layer 150a included in each of the first pixels P1. Here, surface roughness may denote the roughness of a surface of an object to be measured. More specifically, surface roughness is a measure of texture of a surface and is quantified by the vertical deviations of a real surface from the ideal form of the real surface. That is, if the surface of the object has many irregularities and/or if there are large differences between heights of the irregularities formed in the surface of the object, the surface roughness of the object is high. If the surface of the object has few irregularities and/or if there are small differences between the heights of the irregularities formed in the surface of the object, the surface roughness of the object is low. In an exemplary embodiment, the first organic light-emitting layer 150a may include a smooth surface, and the second organic light-emitting layer 150b may include a surface with random irregularities. Specifically, a surface (i.e., a side surface) of the first organic light-emitting layer 150a which faces the second organic light-emitting layer 150b or the third organic light-emitting layer 150c may be smooth, and a surface (i.e., a side surface) of the second organic light-emitting layer 150b which faces the first organic light-emitting layer 150a or the third organic light-emitting layer 150b may be a surface with random irregularities.

The surface roughness of the third organic light-emitting layer 150c included in each of the third pixels P3 may be equal to the surface roughness of the first organic light-emitting layer 150a included in each of the first pixels P1. That is, the surface roughness of the third organic light-emitting layer 150c may be greater than the surface roughness of the second organic light-emitting layer 150b.

The first organic light-emitting layer 150a may protrude out of each of the first pixels P1, and the second organic light-emitting layer 150b may protrude out of each of the second pixels P2. A length by which the second organic light-emitting layer 150b protrudes out of each of the second pixels P2 may be greater than a length by which the first organic light-emitting layer 150a protrudes out of each of the first pixels P1. Here, if the first organic light-emitting layer 150a protrudes out of each of the first pixels P1, edge portions of the first organic light-emitting layer 150a may extend beyond the region in which each of the first pixels P1 is located to be disposed on the pixel defining layer 130 as seen in a plan view. In addition, if the second organic light-emitting layer 150b protrudes out of each of the second pixels P2, edge portions of the second organic light-emitting layer 150b may extend beyond the region in which each of the second pixels P2 is located to be disposed on the pixel defining layer 130 as seen in a plan view. In the exemplary embodiment of FIGS. 1 and 2, the length by which the first organic light-emitting layer 150a protrudes out of each of the first pixels P1 may be D7a, and the length by which the second organic light-emitting layer 150b protrudes out of each of the second pixels P2 may be D7b, wherein the length of D7b may be greater than the length of D7a. Here, a distance between the first organic light-emitting layer 150a and the second organic light-emitting layer 150b may be D7c, and the sum of D7a, D7b and D7c may be equal to D7.

The third organic light-emitting layer 150c may also protrude out of each of the third pixels P3, and a length by which the third organic light-emitting layer 150c protrudes out of each of the third pixels P3 may be equal to the length by which the first organic light-emitting layer 150a protrudes out of each of the first pixels P1. That is, although not shown in FIGS. 1 and 2, the length by which the third organic light-emitting layer 150c protrudes out of each of the third pixels P3 may be D7a.

The adhesion of the first organic light-emitting layer 150a to the first pixel electrode 140a may be greater than the adhesion of the second organic light-emitting layer 150b to the second pixel electrode 140b. That is, the interfacial adhesion between the first organic light-emitting layer 150a and the first pixel electrode 140a may be greater than the interfacial adhesion between the second organic light-emitting layer 150b and the second pixel electrode 140b. In addition, the adhesion of the third organic light-emitting layer 150c to the third pixel electrode 140c may be equal to the adhesion of the first organic light-emitting layer 150a to the first pixel electrode 140a.

Figure 4:
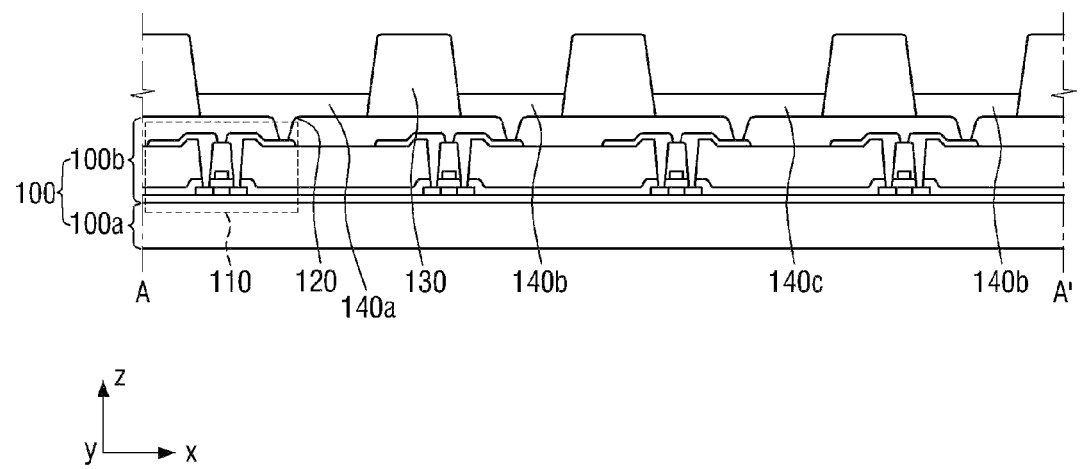
FIG. 4 is a cross-sectional view illustrating an operation of preparing a substrate having a plurality of pixel electrodes and a pixel defining layer in a method of manufacturing the organic luminescence display of FIG. 1.
Figure 5:
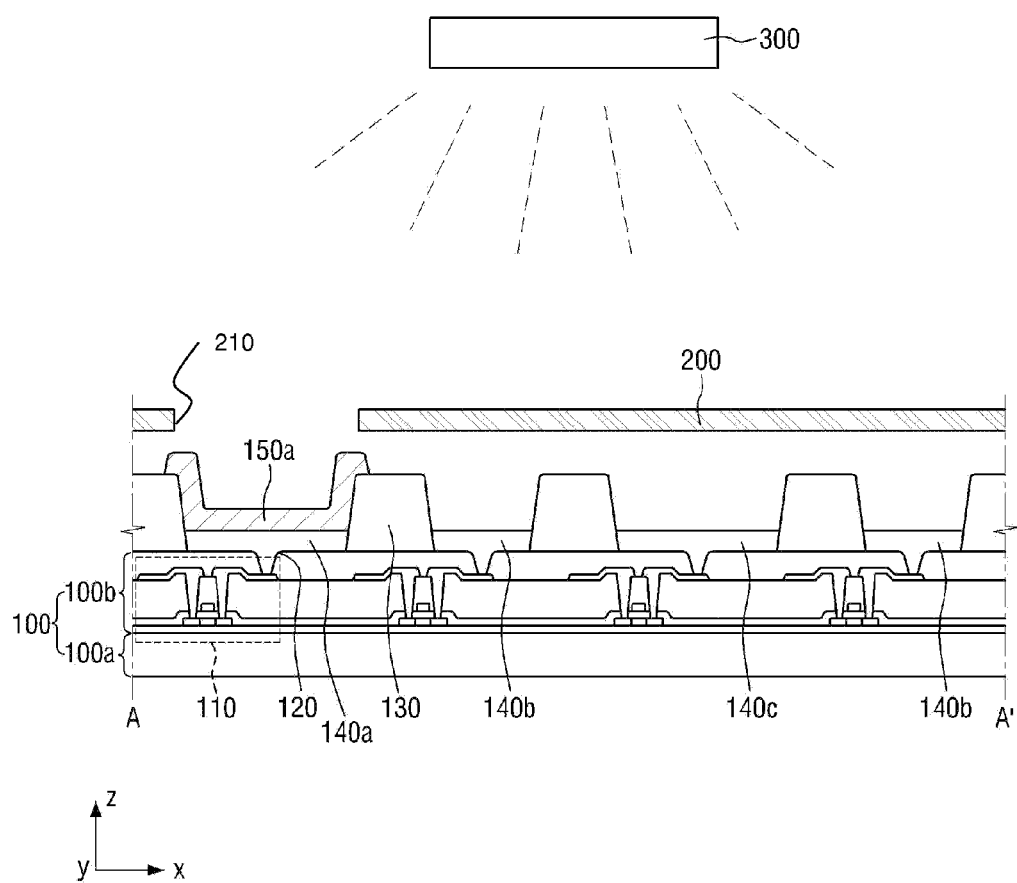
FIG. 5 is a cross-sectional view illustrating an operation of forming a first organic light-emitting layer in the method of manufacturing the organic luminescence display of FIG. 1.
Figure 6:
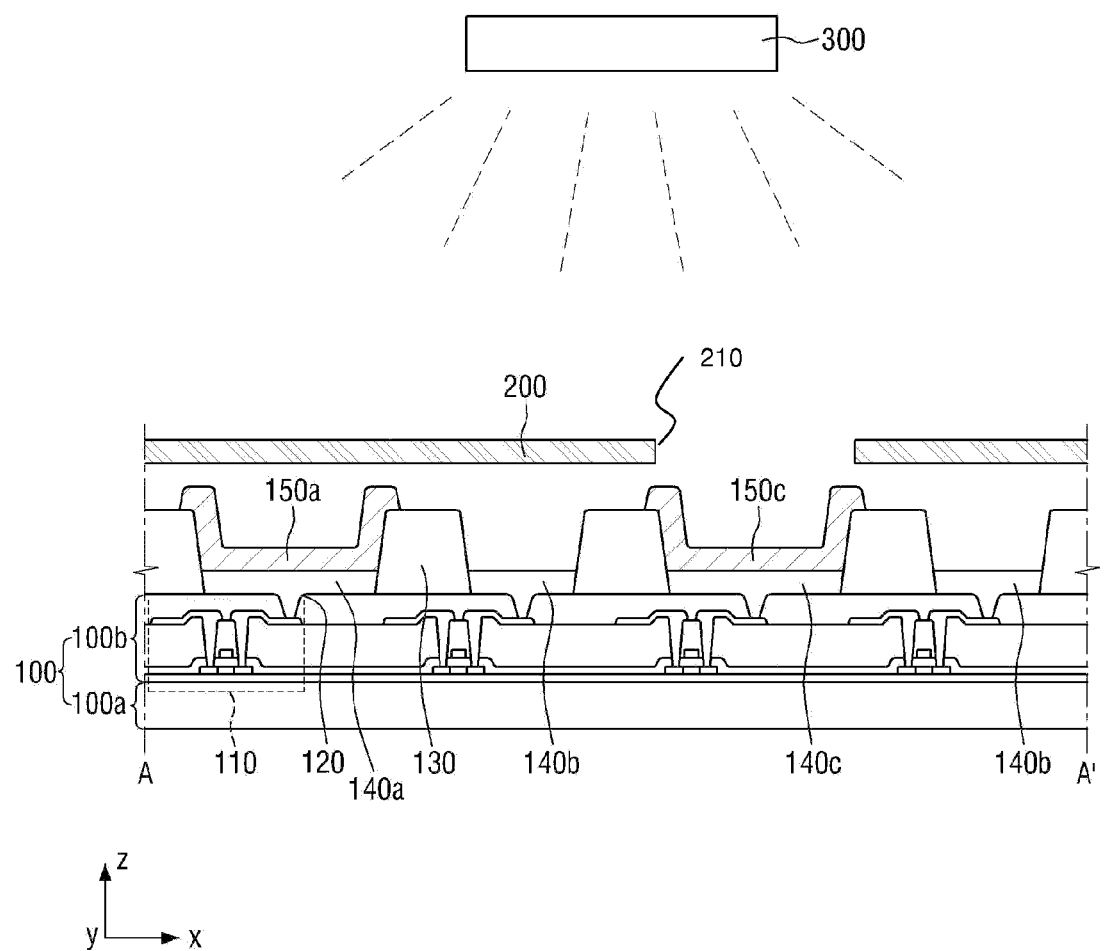
FIG. 6 is a cross-sectional view illustrating an operation of forming a third organic light-emitting layer in the method of manufacturing the organic luminescence display of FIG. 1.
Figure 7:
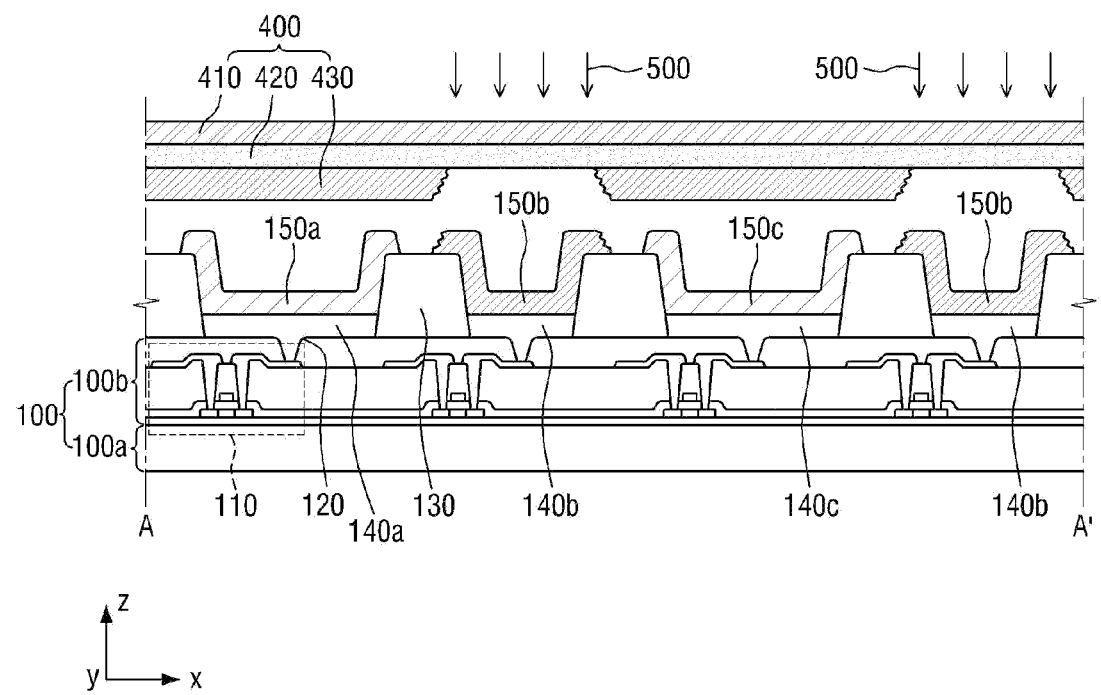
FIG. 7 is a cross-sectional view illustrating an operation of forming a second organic light-emitting layer in the method of manufacturing the organic luminescence display of FIG. 1.
Figure 8:
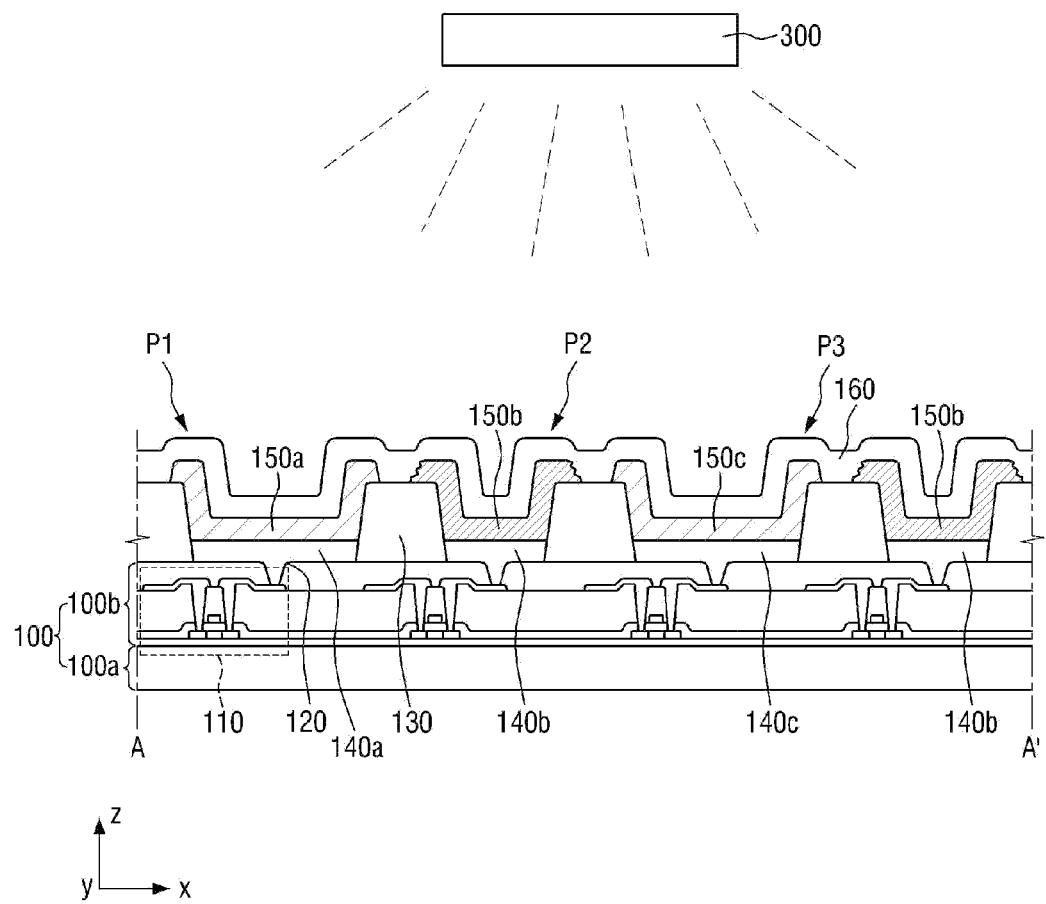
FIG. 8 is a cross-sectional view illustrating an operation of forming a common electrode in the method of manufacturing the organic luminescence display of FIG. 1.

A method of manufacturing an organic luminescence display according to an embodiment of the present invention will now be described with reference to FIGS. 4 through 8. FIG. 4 is a cross-sectional view illustrating an operation of preparing a substrate 100 having a plurality of pixel electrodes (140a, 140b, 140c) and a pixel defining layer 130 in a method of manufacturing the organic luminescence display of FIG. 1. FIG. 5 is a cross-sectional view illustrating an operation of forming a first organic light-emitting layer 150a in the method of manufacturing the organic luminescence display of FIG. 1. FIG. 6 is a cross-sectional view illustrating an operation of forming a third organic light-emitting layer 150c in the method of manufacturing the organic luminescence display of FIG. 1. FIG. 7 is a cross-sectional view illustrating an operation of forming a second organic light-emitting layer 150b in the method of manufacturing the organic luminescence display of FIG. 1. FIG. 8 is a cross-sectional view illustrating an operation of forming a common electrode 160 in the method of manufacturing the organic luminescence display of FIG. 1. For simplicity, elements substantially identical to those of FIGS. 1 through 3 are indicated by like reference numerals, and thus a repetitive description thereof will be omitted.

Referring to FIG. 4, to manufacture the organic luminescence display of FIG. 1, the substrate 100 having the pixel electrodes (140a, 140b, 140c) and the pixel defining layer 130 may be prepared. Here, after the pixel defining layer 130 is formed on the substrate 100, the pixel electrodes may be formed. However, the present invention is not limited thereto, and after the pixel electrodes are formed on the substrate 100, the pixel defining layer 130 may be formed.

Referring to FIG. 5, after the substrate 100 having the pixel electrodes (140a, 140b, 140c) and the pixel defining layer 130 is prepared, the first organic light-emitting layer 150a may be formed by depositing a first organic light-emitting material on a first pixel electrode 140a which is disposed on the substrate 100 and exposed by the pixel defining layer 130. Specifically, a mask 200 having an opening 210 as large as the first pixel electrode 140a exposed by the pixel defining layer 130 may be placed such that the opening corresponds to the first pixel electrode 140a exposed by the pixel defining layer 130. Here, the mask 200 may be a fine metal mask. Next, a deposition source 300 above the mask 200 may evaporate the first organic light-emitting material in a liquid or semi-solid state by heating the first organic light-emitting material. The evaporated first organic light-emitting material may pass through the opening 210 to be deposited on the first pixel electrode 140a exposed by the pixel defining layer 130, thereby forming the first organic light-emitting layer 150a.

Referring to FIG. 6, after the formation of the first organic light-emitting layer 150a, the third organic light-emitting layer 150c may be formed by depositing a third organic light-emitting material on a third pixel electrode 140c which is disposed on the substrate 100 and exposed by the pixel defining layer 130. Specifically, a mask 200 having an opening 210 as large as the third pixel electrode 140c exposed by the pixel defining layer 130 may be placed such that the opening corresponds to the third pixel electrode 140c exposed by the pixel defining layer 130. Then, the deposition source 300 above the mask 200 may evaporate the third organic light-emitting material in a liquid or semi-solid state by heating the third organic light-emitting material. The evaporated third organic light-emitting material may pass through the opening 210 to be deposited on the third pixel electrode 140c exposed by the pixel defining layer 130, thereby forming the third organic light-emitting layer 150c.

Referring to FIG. 7, after the formation of the third organic light-emitting layer 150c, the second organic light-emitting layer 150b may be formed by transferring a transfer layer 430 containing a second organic light-emitting material onto a second pixel electrode 140b which is disposed on the substrate 100 and exposed by the pixel defining layer 130.

Specifically, a donor substrate 400 including a base film 410, a light-to-heat conversion layer 420 and the transfer layer 430 may be placed on the second pixel electrode 140b such that the transfer layer 430 faces the substrate 100.

The base film 410 may be formed of transparent polymer. Examples of the transparent polymer include polyester such as polyethylene terephthalate, polyacryl, polyepoxy, polyethylene, polystyrene, and the like. Among these examples, the polyethylene terephthalate film is mainly used. The base film 410 should have optical properties and mechanical stability as a support film. The base film 140 may have a thickness of 10 to 500 μm.

The light-to-heat conversion layer 420 may be disposed on the base film 410. The light-to-heat conversion layer 420 absorbs light in the infrared ray-visible ray range and converts some of the light into heat. To this end, the light-to-heat conversion layer 420 should have optical density and includes a light absorbing material. The light-to-heat conversion layer 420 may be a metal layer which contains aluminum oxide or aluminum sulfide as the light absorbing material or a polymer organic layer which contains carbon black, graphite or infrared dye as the light absorbing material. If the light-to-heat conversion layer 420 is the metal layer, it may be formed to a thickness of 100 to 5,000 Å by vacuum deposition, electron beam deposition or sputtering. If the light-to-heat conversion layer 420 is the polymer organic layer, it may be formed to a thickness of 0.1 to 10 μm by typical film coating methods such as roll coating, gravure coating, extrusion coating, spin coating, and knife coating.

The transfer layer 430 may be disposed on the light-to-heat conversion layer 420. The transfer layer 430 is a layer that is actually transferred onto the substrate 100. The transfer layer 430 may be formed of the same material as the second organic light-emitting layer 150b and may have the same stacked structure as the second organic light-emitting layer 150b.

Although not shown in the drawing, the donor substrate 400 may further include an intermediate layer. The intermediate layer may be disposed between the light-to-heat conversion layer 420 and the transfer layer 430. The intermediate layer may prevent the light absorbing material (e.g., carbon black) of the light-to-heat conversion layer 420 from contaminating the transfer layer 430 formed in a subsequent process. The intermediate layer may be formed of acrylic resin or alkyd resin. The intermediate layer may be formed by a typical coating process such as solvent coating and a curing process such as ultraviolet curing.

Although not shown in the drawing, the donor substrate 400 may further include a buffer layer. The buffer layer may be disposed between the light-to-heat conversion layer 420 and the transfer layer 430 or, if the intermediate layer is present, between the intermediate layer and the transfer layer 430. The buffer layer may be formed to prevent the damage to an organic layer formed in the transfer layer 430 and effectively adjust the adhesion between the light-to-heat conversion layer 420 and the transfer layer 430 or if the intermediate layer is present, between the intermediate layer and the transfer layer 430. The buffer layer may contain at least one of an insulating material, a metal, and a metal oxide.

The transfer layer 430 may be transferred onto the second pixel electrode 140b by irradiating, beams of a laser 500 to a region of the donor substrate 400 which faces the second pixel electrode 140b exposed by the pixel defining layer 130. As a result, the second organic light-emitting layer 150b may be formed on the second pixel electrode 140b. That is the transfer layer 430 transferred onto the substrate 100 may be the second organic light-emitting layer 150b. Here, the laser 500 may be any one of general-purpose lasers such as solid, gas, semiconductor, pigments, etc. The beams of the laser 500 may come in circular or other possible shapes. However, the laser 500 is merely an example, and the present invention is not limited to this example. That is, a xenon (Xe) lamp or a flash lamp can also be used.

Referring to FIG. 8, after the formation of the second organic light-emitting layer 150b, the common electrode 160 may be formed on the first organic light-emitting layer 150a, the second organic light-emitting layer 150b, and the third organic light-emitting layer 150c. Specifically, an open mask (not shown) may be placed to correspond to the substrate 100. Then, the deposition source 300 above the open mask may evaporate an electrode material in a liquid or semi-solid state by heating the electrode material. The evaporated electrode material may be deposited on the first organic light-emitting layer 150a, the second organic light-emitting layer 150b and the third organic light-emitting layer 150c, thereby forming the common electrode 160.

In the above-described method of manufacturing the organic luminescence display according to the current embodiment, a minimum width of the second pixel electrode 140b exposed by the pixel defining layer 130 may be smaller than a minimum width of the first pixel electrode 140a exposed by the pixel defining layer 130. Here, the minimum width of the second pixel electrode 140b exposed by the pixel defining layer 130 may be 1 to 10 μm, preferably, 3 to 7 μm.

In addition, the first pixel electrode 140a exposed by the pixel defining layer 130 may be dot-shaped, and the second pixel electrode 140b exposed by the pixel defining layer 130 may be stripe-shaped.

As described above, in the organic luminescence display and the method of manufacturing the same according to the current embodiment, first and third pixels P1 and P3 which are large in size may formed by a deposition process, and second pixels P2 which are small in size may be formed by a transfer process, i.e., a laser induced thermal imaging (LITI) process. Specifically, the dot-shaped first and third pixels P1 and P3 may be formed by a deposition process, and the stripe-shaped second pixels P2 may be formed by a transfer process.

If a deposition process is used to form the second organic light-emitting layer 150b of each of the stripe-shaped second pixels P2, since an opening of a mask 200 used in the deposition process is narrow, the opening may be clogged with the second organic light-emitting material evaporating from the deposition source 300. Moreover, the mask 200 that may droop or be pressed may contaminate the first organic light-emitting layer 150a and the third organic light-emitting layer 150c already formed on the substrate 100. These phenomena may cause defects such as dark spots, thereby degrading the high-resolution image quality of the organic luminescence display. Also, they may increase the process time and cost, causing the overall work loss. In particular, if the minimum width of each of the second pixels P2 is 1 to 10 μm or, preferably, 3 to 7 μm, it is difficult to manufacture the mask 200 corresponding to this minimum width. Even if the mask 200 corresponding to this minimum width can be manufactured, the opening of the mask 200 may be clogged immediately after the initiation of a deposition process. Consequently, it may be very difficult to form the second organic light-emitting layer 150b as desired.

In this regard, a transfer process may be used to form the second organic light-emitting layer 150b of each of the stripe-shaped second pixels P2. In this case, the above phenomena can be prevented. As a result, a high-quality organic luminescence display can be manufactured, and unnecessary work loss can be reduced by reducing the process time and cost.

On the other hand, a conventional deposition process may be used to form the first organic light-emitting layer 150a and the third organic light-emitting layer 150c of the dot-shaped first and third pixels P1 and P3. This ensures high efficiency and stability.

Lengths by which the first organic light-emitting layer 150a and the third organic light-emitting layer 150c formed by a deposition process protrude out of each of the first pixels P1 and each of the third pixels P3, respectively, can be adjusted by controlling the opening 200 of the mask 200. However, it may be difficult to adjust a length by which the second organic light-emitting layer 150b formed by a transfer process protrudes out of each of the second pixels P2 due to cohesion characteristics inside the transfer layer 430.

Therefore, in the organic luminescence display according to the current embodiment, the second organic light-emitting layer 150b whose protruding length is difficult to adjust is placed between the first and third organic light-emitting layers 150a and 150c whose protruding lengths are easy to adjust. Accordingly, the distance between the pixels can not only be adjusted easily but also be reduced, thereby improving the overall aperture ratio of the organic luminescence display. Specifically, the length by which the second organic light-emitting layer 150b protrudes out of each of the second pixels P2 may be within a predetermined range, and as long as the length by which the second organic light-emitting layer 150b protrudes out of each of the second pixels P2 is within the predetermined range, it is possible to adjust the length by which the first organic light-emitting layer 150a protrudes out of each of the first pixels P1 and the length by which the third organic light-emitting layer 150c protrudes out of each of the third pixels P3 between the first organic light-emitting layer 150 and the second organic light-emitting layer 150b and between the second organic light-emitting layer 150b and the third organic light-emitting layer 150c. Accordingly, the distance between the pixels can not only be adjusted easily but also be reduced.

Figure 9:
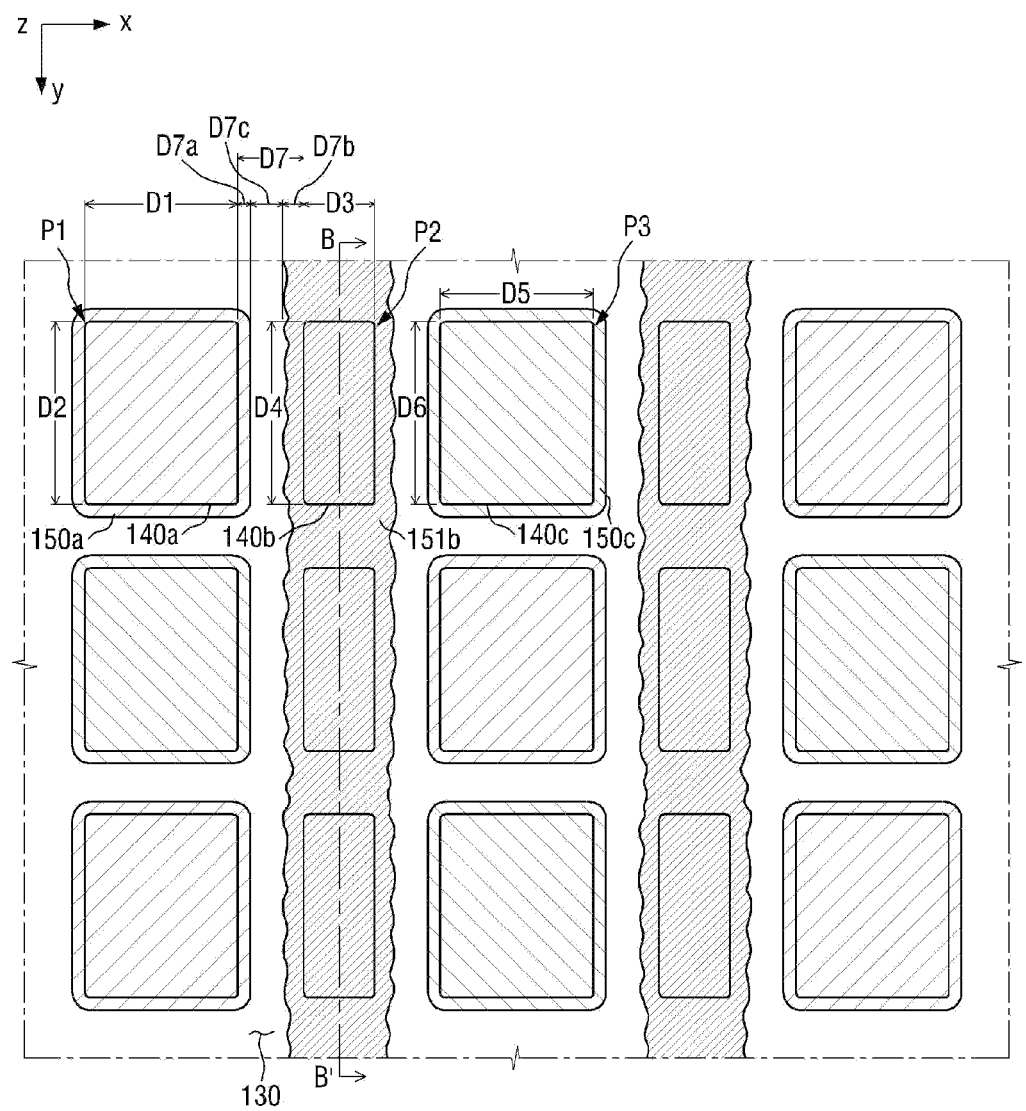
FIG. 9 is a plan view schematically illustrating an arrangement of pixels of an organic luminescence display constructed as another embodiment according to the principles of the present invention.
Figure 10:
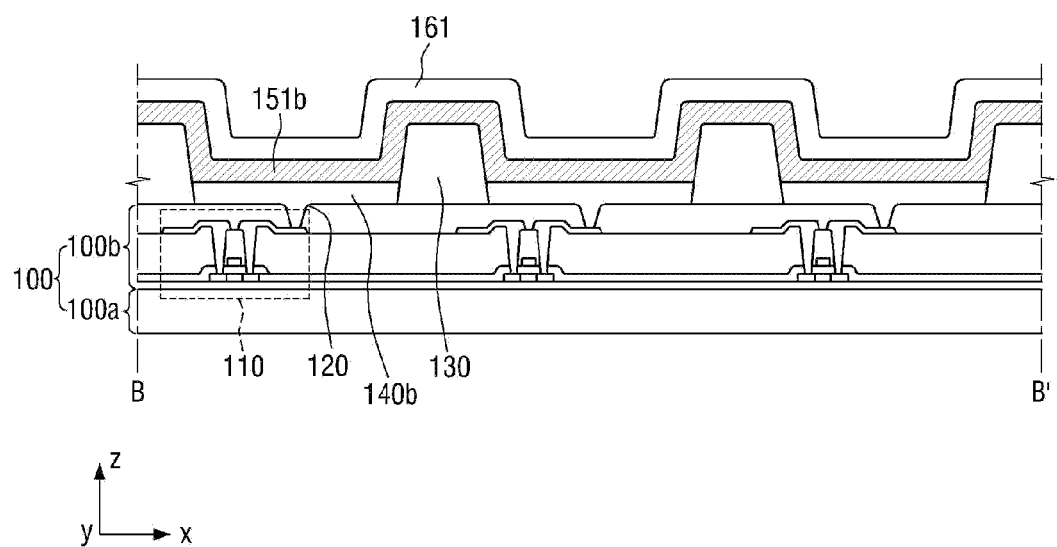
FIG. 10 is a cross-sectional view taken along line B-B' of FIG. 9.

FIG. 9 is a plan view schematically illustrating the pixel arrangement of an organic luminescence display constructed as another embodiment according to the principles of the present invention. FIG. 10 is a cross-sectional view taken along line B-B' of FIG. 9. For simplicity, elements substantially identical to those of FIGS. 1 through 3 are indicated by like reference numerals, and thus a repetitive description thereof will be omitted.

Referring to FIGS. 9 and 10, in the organic luminescence display according to the current embodiment, a second organic light-emitting layer 151b may extend continuously over all rows in an $(n+1)^{th}$ column and an $(n+3)^{th}$ column.

As a result, the second organic light-emitting layer 151b may be located in a region between a plurality of second pixels P2 in a column direction. In this region, no electric current flows because a second pixel electrode 140b does not exist while a pixel defining layer 130 exists. Thus, light is not emitted.

In the organic luminescence display according to the current embodiment, since the second organic light-emitting layer 151b is continuously formed at a time as described above, process efficiency can be increased.

In addition, a reduction in the flatness of the organic luminescence display due to an overlap between second organic light-emitting layers 151b adjacent in the column direction can be prevented.

Further, a common electrode 161 formed on the pixel defining layer 130 in the $(n+1)^{th}$ column and the $(n+3)^{th}$ column may be flat. Therefore, the flatness of the organic luminescence display can be ensured more easily.

Figure 11:
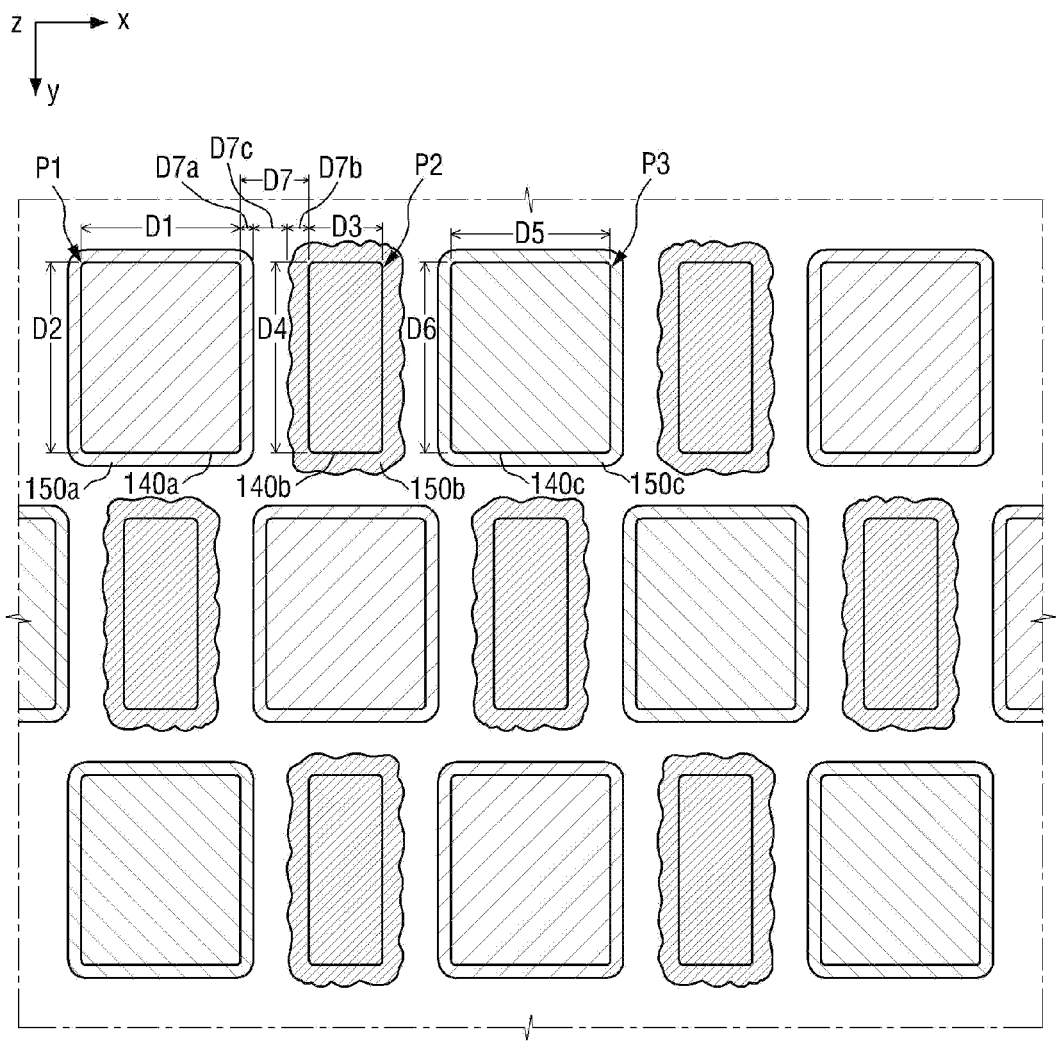
FIG. 11 is a plan view schematically illustrating an arrangement of pixels of an organic luminescence display constructed as another embodiment according to the principles of the present invention.

FIG. 11 is a plan view schematically illustrating the pixel arrangement of an organic luminescence display according to another embodiment of the present invention. For simplicity, elements substantially identical to those of FIGS. 1 through 3 are indicated by like reference numerals, and thus a repetitive description thereof will be omitted.

Referring to FIG. 11, in the organic luminescence display according to the current embodiment, each of a plurality of first pixels P1 or each of a plurality of third pixels P3 may be surrounded by a plurality of second pixels P2, and each of the second pixels P2 may be surrounded by the first pixels P1 and the third pixels P3. In an exemplary embodiment, even-numbered rows or odd-numbered rows may be shifted in a row direction by a predetermined distance. Specifically, since the even-numbered rows or the odd-numbered rows are shifted in the row direction by the predetermined distance, each of the first pixels P1 may be adjacent to two second pixels P2 in a column direction, each of the second pixels P2 may be adjacent to a first pixel P1 and a third pixel P3 in the column direction, and each of the third pixels P3 may be adjacent to two second pixels P2 in the column direction.

As described above, in the organic luminescence display according to the current embodiment, a distance between second organic light-emitting layers 150b whose protruding distance is hard to adjust is increased as much as possible.

Therefore, the aperture ratio of the organic luminescence display can be improved further.

Figure 12:
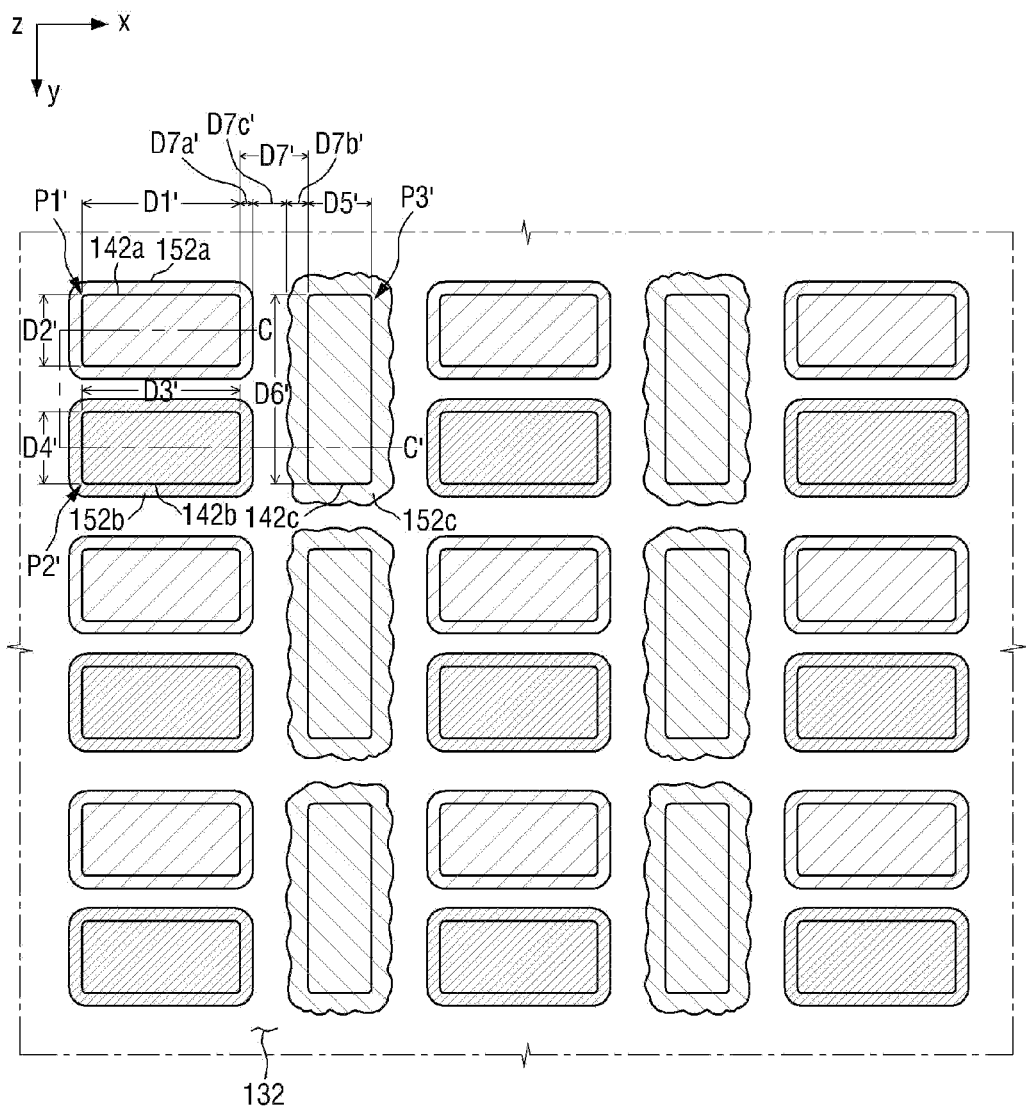
FIG. 12 is a plan view schematically illustrating an arrangement of pixels of an organic luminescence display constructed as another embodiment according to the principles of the present invention.
Figure 13:
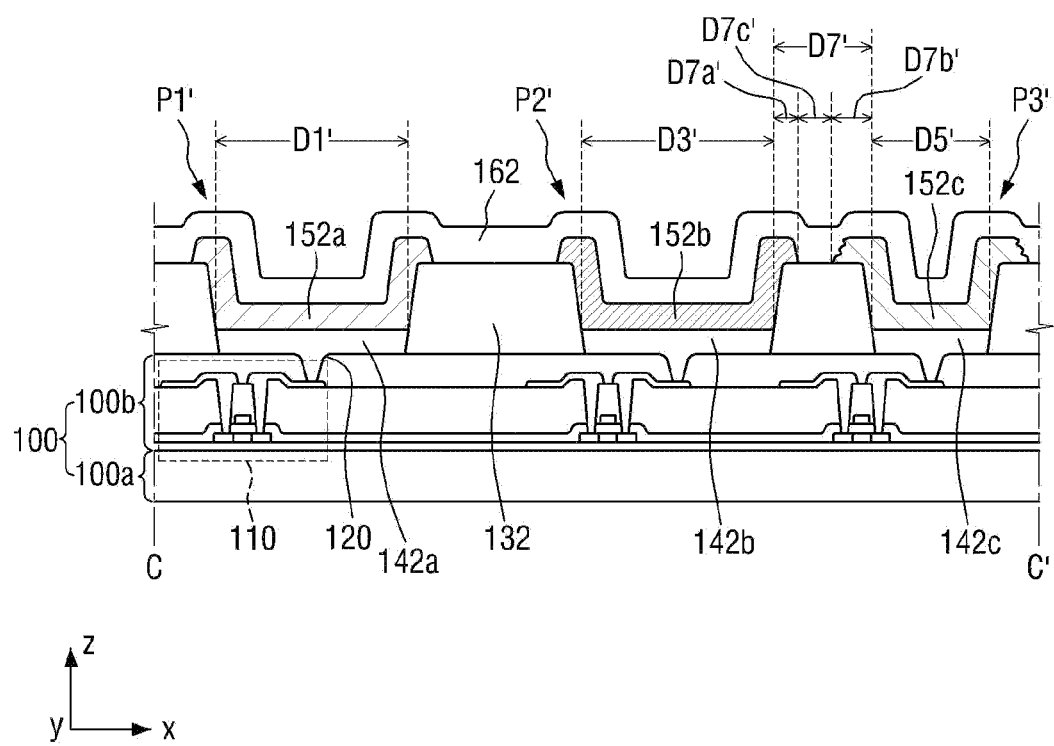
FIG. 13 is a cross-sectional view taken along line C-C' of FIG. 12.

FIG. 12 is a plan view schematically illustrating the pixel arrangement of an organic luminescence display according to another embodiment of the present invention. FIG. 13 is a cross-sectional view taken along line C-C' of FIG. 12. For simplicity, elements substantially identical to those of FIGS. 1 through 3 are indicated by like reference numerals, and thus a repetitive description thereof will be omitted.

Referring to FIG. 12, a plurality of first pixels P1', a plurality of second pixels P2', and a plurality of third pixels P3' may be separated from each other by a pixel defining layer 132. Each of the first pixels P1' may be shaped like a quadrangle including long sides having a length of D1' and short sides having a length of D2', each of the second pixels P2' may be shaped like a quadrangle including long sides having a length of D3' and short sides having a length of D4', and each of the third pixels P3' may be shaped like a quadrangle including short sides having a length of D5' and long sides having a length of D6'. That is, each of the first pixels P1' may be formed in a region of D1'×D2', each of the second pixels P2' may be formed in a region of D3'×D4', and each of the third pixels P3' may be formed in a region of D5'×D6'. While the first pixels P1', the second pixels P2' and the third pixels P3' may be quadrangular as described above, their shape is not limited to the quadrangular shape. That is, the first pixels P1', the second pixels P2' and the third pixels P3' may also be circular, ellipsoidal, or polygonal. In addition, at least one of the first through third pixels P1' through P3' may have a different shape from that of the other pixels.

Referring to FIG. 13, each of the first pixels P1' may include a first organic light emitting layer 152a which overlaps a first pixel electrode 142a, each of the second pixels P2' may include a second organic light-emitting layer 152b which overlaps a second pixel electrode 142b, and each of the third pixels P3' may include a third organic light-emitting layer 152c which overlaps a third pixel electrode 142c. In addition, each of the first pixels P1' may further include the first pixel electrode 142a and a common electrode 162 which overlaps the first pixel electrode 142a, each of the second pixels P2' may further include the second pixel electrode 142b and the common electrode 162 which overlaps the second pixel electrode 142b, and each of the third pixels P3' may further include the third pixel electrode 142c and the common electrode 162 which overlaps the third pixel electrode 142c. Each of the first through third pixels P1' through P3' may further include a power supply unit (not shown) which applies an electric potential to the common electrode 162 and a corresponding one of the first pixel electrode 142a, the second pixel electrode 142b and the third pixel electrode 142c.

Referring back to FIG. 12, an $n^{th}$ column of a plurality of pixels (P1', P2', P3') may include the first pixels P1' and the second pixels P2' arranged alternately, and an $(n+1)^{th}$ column adjacent to the $n^{th}$ column may include the third pixels P3'. Each of the third pixels P3' may extend continuously over a row in which the first pixels P1' are arranged and a row in which the second pixels P2' adjacent to the first pixels P1' are arranged. Here, if each of the third pixels P3' extends continuously over a row in which the first pixels P1' are arranged and a row in which the second pixels P2' adjacent to the first pixels P1' are arranged, it means that each of the third pixels P3' also exists between the row in which the first pixels P1' are arranged and the row in which the second pixels P2' adjacent to the first pixels P1' are arranged.

Each of the first pixels P1' may be adjacent to the third pixels P3' in a row direction and may be adjacent to the second pixels P2' in a column direction. Each of the second pixels P2' may be adjacent to the third pixels P3' in the row direction and may be adjacent to the first pixels P1' in the column direction. Each of the third pixels P3' may be adjacent to the first pixels P1' and the second pixels P2' in the row direction and may be adjacent to other third pixels P3' in the column direction.

A distance between the first and third pixels P1' and P3' and a distance between the second and third pixels P2' and P3' may be D7'. Although not shown in the drawing, a distance between the first and second pixels P1' and P2' may also be D7'.

The pixel arrangement may be a repetition of the $n^{th}$ column and the $(n+1)^{th}$ column in this order in the row direction.

Referring again to FIG. 12, a size of the first pixels P1' may be equal to a size of the second pixels P2', and a size of the third pixels P3' may be smaller than the size of the first pixels P1'. In an exemplary embodiment, the first and second pixels P1' and P2' may be dot-shaped, and the third pixels P3' may be stripe-shaped. Specifically, the first through third pixels P1' through P3' may be quadrangular, the length of the short sides of each of the first pixels P1' may be equal to the length of the short sides of each of the second pixels P2', and the length of the short sides of each of the third pixels P3' may be greater than the length of the short sides of each of the first pixels P1'. In the exemplary embodiment of FIG. 12, the length D2' of the short sides of each of the first pixels P1' may be equal to the length D4' of the short sides of each of the second pixels P2', and the length D5' of the short sides of each of the third pixels P3' may be smaller than the length D2' of the short sides of each of the first pixels P1'. In addition, the length of the long sides of each of the third pixels P3' may be two to five times the length of the short sides of each of the first pixels P1'. That is, a minimum width of each of the first pixels P1' and a minimum width of each of the second pixels P2' may be equal to or greater than a first width, and a minimum width of each of the third pixels P3' may be equal to or smaller than a second width which is smaller than the first width. Here, the first width may be greater than 10 μm, and the second width may be 1 to 10 μm, preferably, 3 to 7 μm.

Referring again to FIGS. 12 and 13, the surface roughness of the first organic light-emitting layer 152a may be equal to the surface roughness of the second organic light-emitting layer 152b, and the surface roughness of the third organic light-emitting layer 152c may be greater than the surface roughness of the first organic light-emitting layer 152a. In an exemplary embodiment, each of the first organic light-emitting layer 152a and the second organic light-emitting layer 152b may include a smooth surface, and the third organic light-emitting layer 152c may include a surface with random irregularities.

In addition, a length by which the third organic light-emitting layer 150c protrudes out of each of the third pixels P3' may be greater than a length by which the first organic light-emitting layer 152a protrudes out of each of the first pixels P1' and a length by which the second organic light-emitting layer 152b protrudes out of each of the second pixels P2'. In the exemplary embodiment of FIGS. 12 and 13, the length by which the first organic light-emitting layer 152a protrudes out of each of the first pixels P1' and the length by which the second organic light-emitting layer 152b protrudes out of each of the second pixels P2' may be D7a', and the length by which the third organic light-emitting layer 152c protrudes out of each of the third pixels P3' may be D7b', wherein the length of D7b' may be greater than the length of D7a'. Here, a distance between the first organic light-emitting layer 152a and the third organic light-emitting layer 152c and a distance between the second organic light-emitting layer 152b and the third organic light-emitting layer 152c may be D7c', and the sum of D7a', D7b' and D7c' may be equal to D7'.

The adhesion of the first organic light-emitting layer 152a to the first pixel electrode 142a and the adhesion of the second organic light-emitting layer 152b to the second pixel electrode 142b may be greater than the adhesion of the third organic light-emitting layer 152c to the third pixel electrode 142c.

Figure 15:
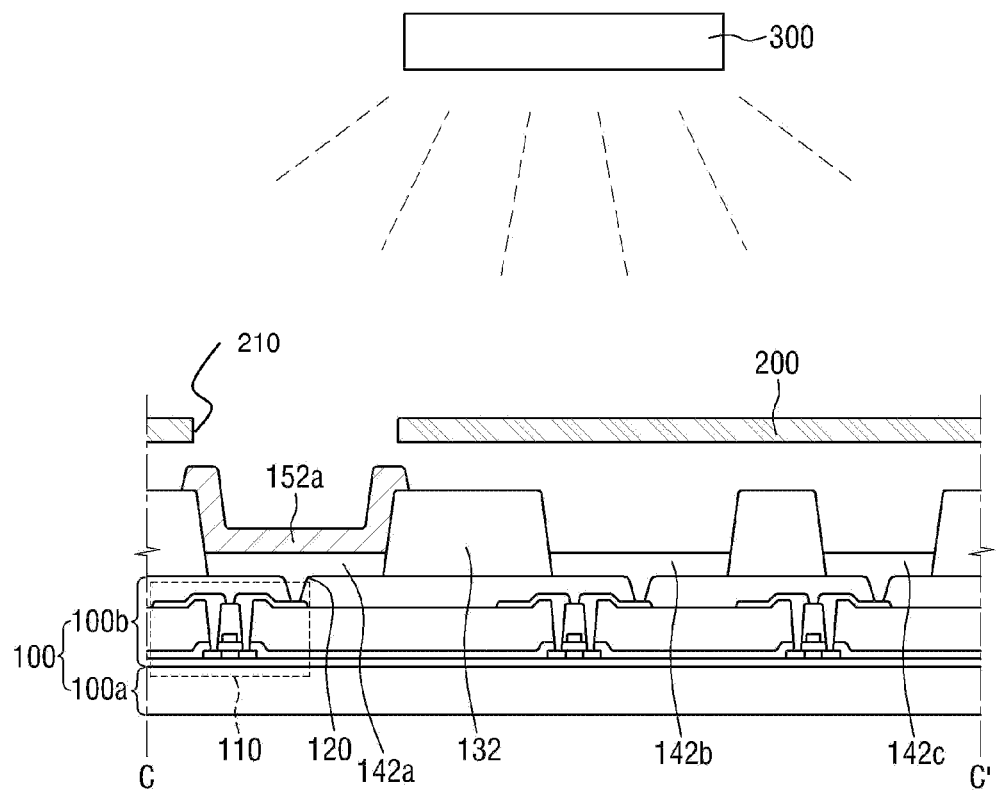
FIG. 15 is a cross-sectional view illustrating an operation of forming a first organic light-emitting layer in the method of manufacturing the organic luminescence display of FIG. 12.
Figure 16:
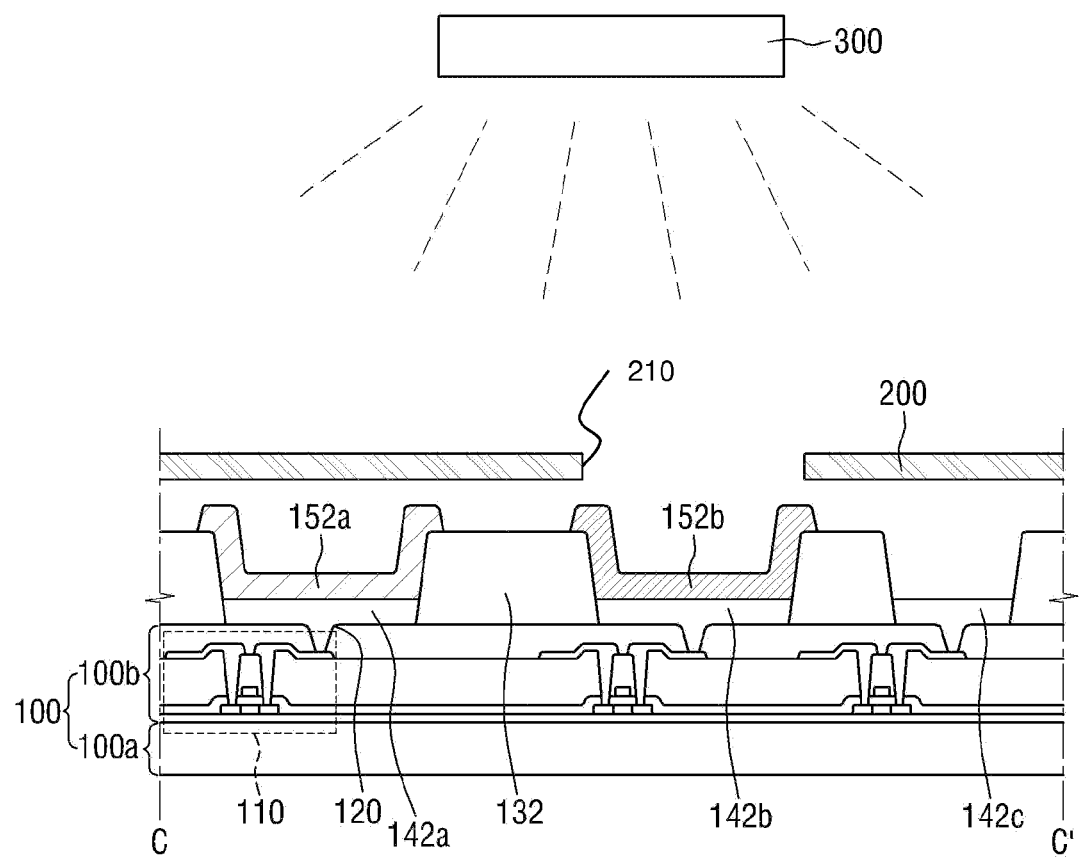
FIG. 16 is a cross-sectional view illustrating an operation of forming a second organic light-emitting layer in the method of manufacturing the organic luminescence display of FIG. 12.
Figure 17:
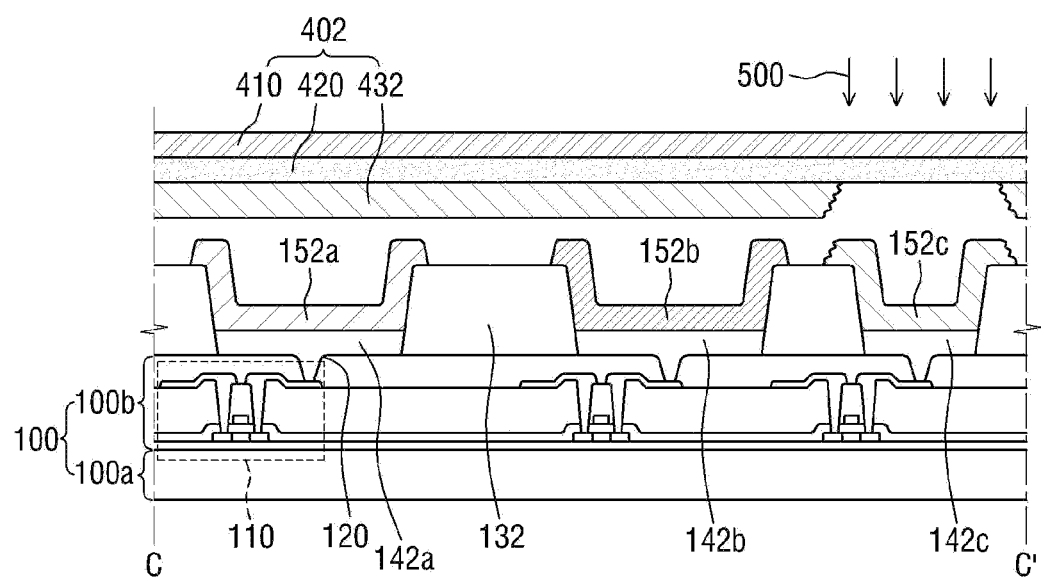
FIG. 17 is a cross-sectional view illustrating an operation of forming a third organic light-emitting layer in the method of manufacturing the organic luminescence display of FIG. 12.
Figure 18:
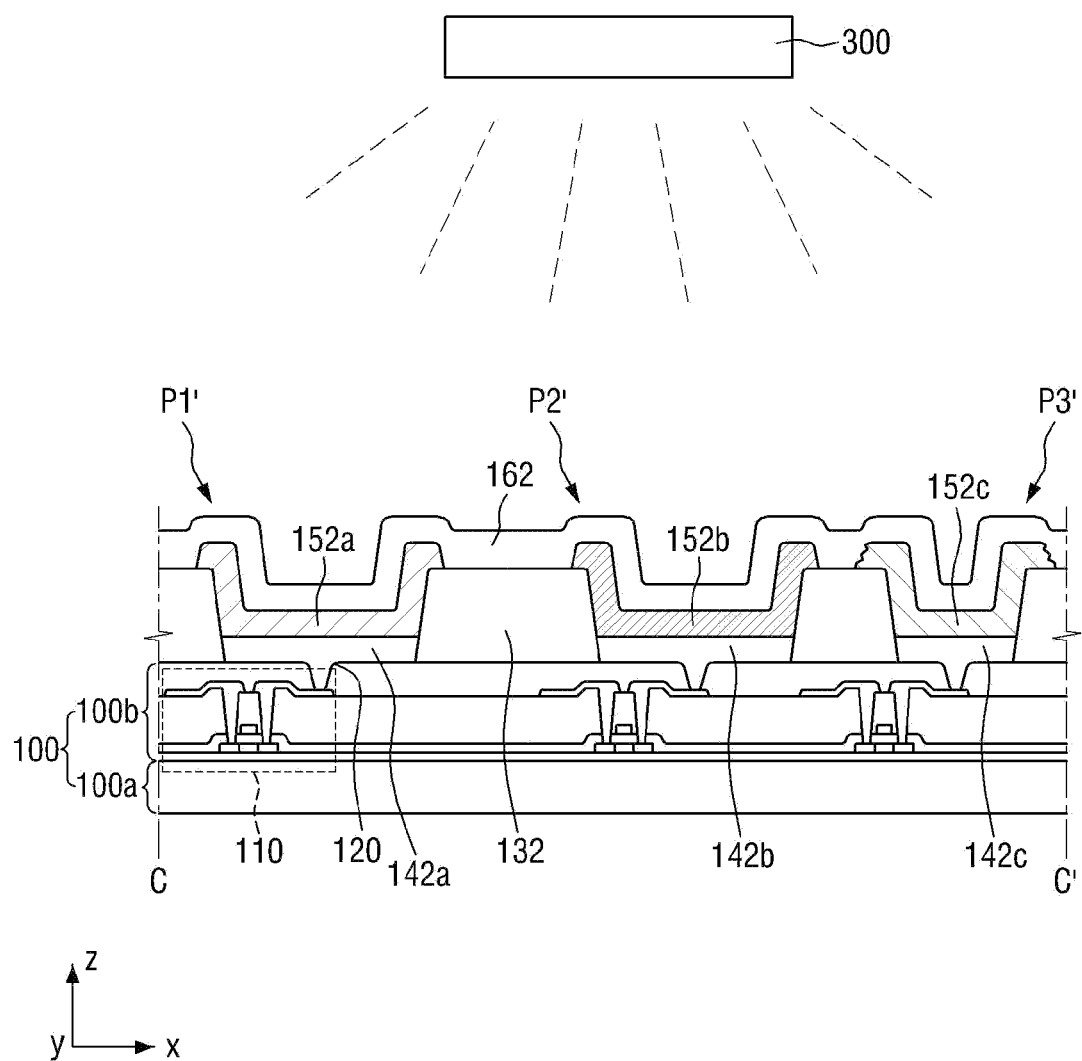
FIG. 18 is a cross-sectional view illustrating an operation of forming a common electrode in the method of manufacturing the organic luminescence display of FIG. 12.

A method of manufacturing an organic luminescence display according to another embodiment of the present invention will now be described with reference to FIGS. 14 through 18. FIG. 14 is a cross-sectional view illustrating an operation of preparing a substrate 100 having a plurality of pixel electrodes (142a, 142b, 142c) and a pixel defining layer 132 in a method of manufacturing the organic luminescence display of FIG. 12. FIG. 15 is a cross-sectional view illustrating an operation of forming a first organic light-emitting layer 152a in the method of manufacturing the organic luminescence display of FIG. 12. FIG. 16 is a cross-sectional view illustrating an operation of forming a second organic light-emitting layer 152b in the method of manufacturing the organic luminescence display of FIG. 12. FIG. 17 is a cross-sectional view illustrating an operation of forming a third organic light-emitting layer 152c in the method of manufacturing the organic luminescence display of FIG. 12. FIG. 18 is a cross-sectional view illustrating an operation of forming a common electrode 162 in the method of manufacturing the organic luminescence display of FIG. 12. For simplicity, elements substantially identical to those of FIGS. 4 through 8 are indicated by like reference numerals, and thus a repetitive description thereof will be omitted.

Referring to FIG. 14, the substrate 100 having the pixel electrodes (142a, 142b, 142c) and the pixel defining layer 132 may be prepared.

Referring to FIG. 15, after the substrate 100 having the pixel electrodes (142a, 142b, 142c) and the pixel defining layer 132 is prepared, the first organic light-emitting layer 152a may be formed by depositing a first organic light-emitting material on a first pixel electrode 142a which is disposed on the substrate 100 and exposed by the pixel defining layer 132.

Referring to FIG. 16, after the formation of the first organic light-emitting layer 152a, the second organic light-emitting layer 152b may be formed by depositing a second organic light-emitting material on a second pixel electrode 142b which is disposed on the substrate 100 and exposed by the pixel defining layer 132.

Referring to FIG. 17, after the formation of the second organic light-emitting layer 152b, the third organic light-emitting layer 152c may be formed by transferring a transfer layer 432 containing a third organic light-emitting material onto a third pixel electrode 142c which is disposed on the substrate 100 and exposed by the pixel defining layer 132.

Specifically, a donor substrate 402 including a base film 410, a light-to-heat conversion layer 420 and the transfer layer 432 may be placed on the third pixel electrode 142c such that the transfer layer 432 faces the substrate 100. Then, the transfer layer 432 may be transferred onto the third pixel electrode 142c by irradiating beams of a laser 500 to a region of the donor substrate 402 which faces the third pixel electrode 142c exposed by the pixel defining layer 132. As a result, the third organic light-emitting layer 152c may be formed on the third pixel electrode 142c.

Referring to FIG. 18, after the formation of the third organic light-emitting layer 152c, the common electrode 162 may be formed on the first organic light-emitting layer 152a, the second organic light-emitting layer 152b, and the third organic light-emitting layer 152c.

In the above-described method of manufacturing the organic luminescence display according to the current embodiment, a minimum width of the third pixel electrode 142c exposed by the pixel defining layer 132 may be smaller than a minimum width of the first pixel electrode 142a exposed by the pixel defining layer 132 and a minimum width of the second pixel electrode 142b exposed by the pixel defining layer 132.

As described above, in the organic luminescence display and the method of manufacturing the same according to the current embodiment, first and second pixels P1' and P2' which are large in size may formed by a deposition process, and third pixels P3' which are small in size may be formed by a transfer process. Specifically, the dot-shaped first and second pixels P1' and P2' may be formed by a deposition process, and the stripe-shaped third pixels P3' may be formed by a transfer process.

Therefore, a high-quality organic luminescence display can be manufactured, and unnecessary work loss can be reduced by reducing the process time and cost. In addition, since a conventional deposition process is still used, high efficiency and stability can be ensured. Further, the overall aperture ratio of the organic luminescence display can be improved.

Figure 19:
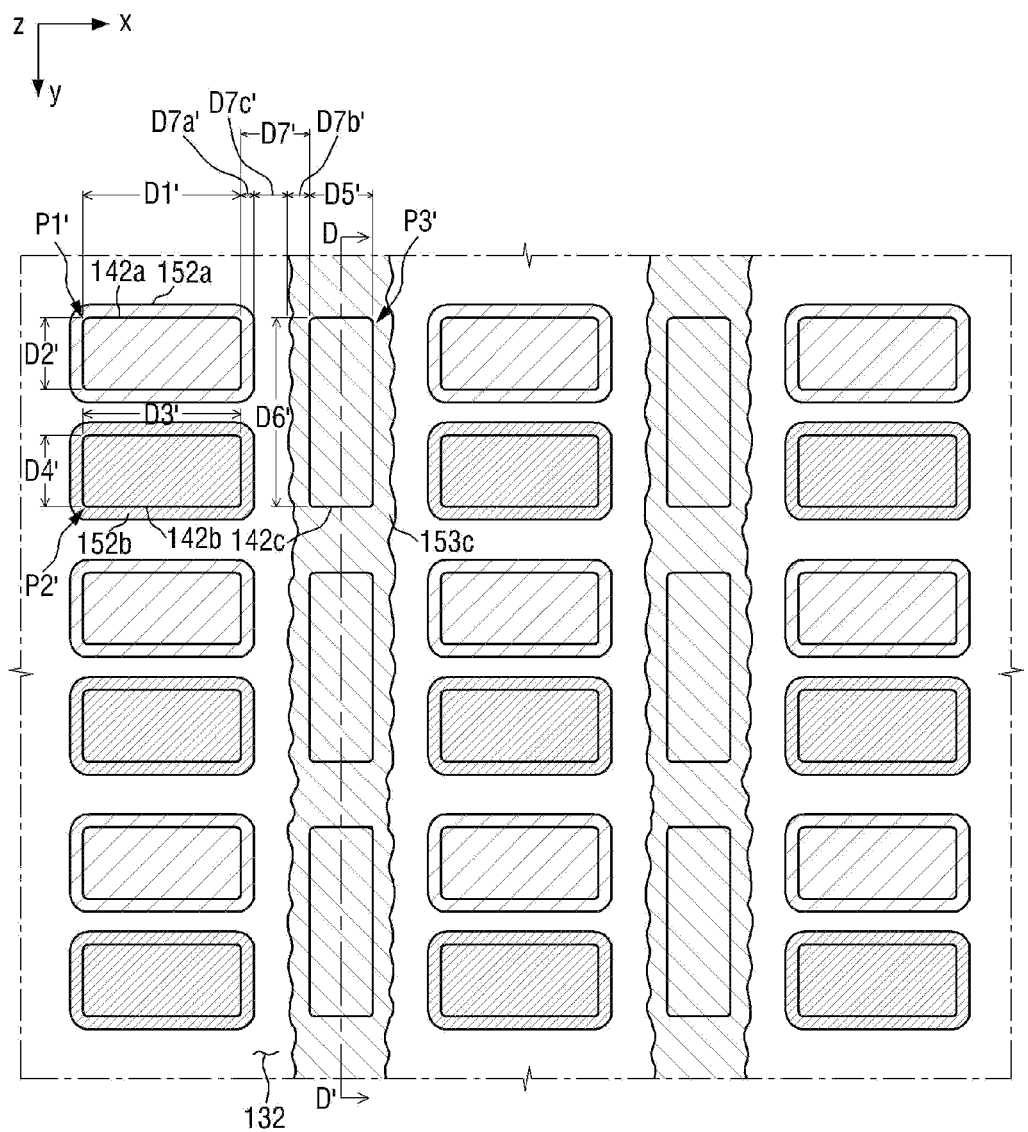
FIG. 19 is a plan view schematically illustrating an arrangement of pixels of an organic luminescence display constructed as another embodiment according to the principles of the present invention.
Figure 20:
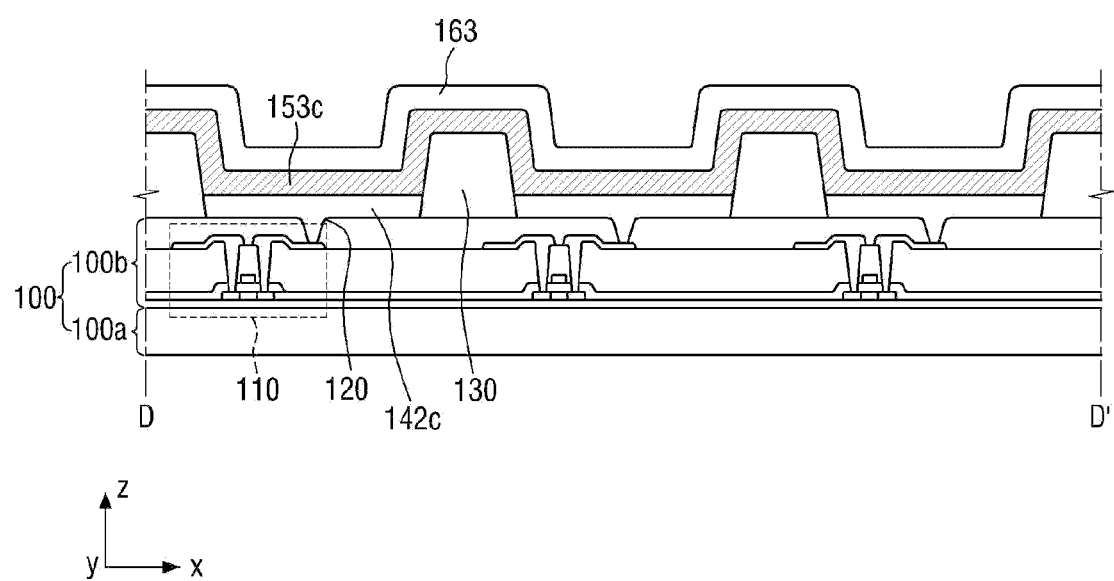
FIG. 20 is a cross-sectional view taken along line D-D' of FIG. 19.

FIG. 19 is a plan view schematically illustrating the pixel arrangement of an organic luminescence display according to another embodiment of the present invention. FIG. 20 is a cross-sectional view taken along line D-D' of FIG. 19. For simplicity, elements substantially identical to those of FIGS. 12 through 13 are indicated by like reference numerals, and thus a repetitive description thereof will be omitted.

Referring to FIGS. 19 and 20, in the organic luminescence display according to the current embodiment, a third organic light-emitting layer 153c may extend continuously over all rows in an $(n+1)^{th}$ column.

In the organic luminescence display according to the current embodiment, since the third organic light-emitting layer 153c is continuously formed at a time as described above, process efficiency can be increased.

In addition, a reduction in the flatness of the organic luminescence display due to an overlap between third organic light-emitting layers 153c adjacent in a column direction can be prevented.

Further, a common electrode 163 formed on the pixel defining layer 132 in the $(n+1)^{th}$ column may be flat. Therefore, the flatness of the organic luminescence display can be ensured more easily.

Figure 21:
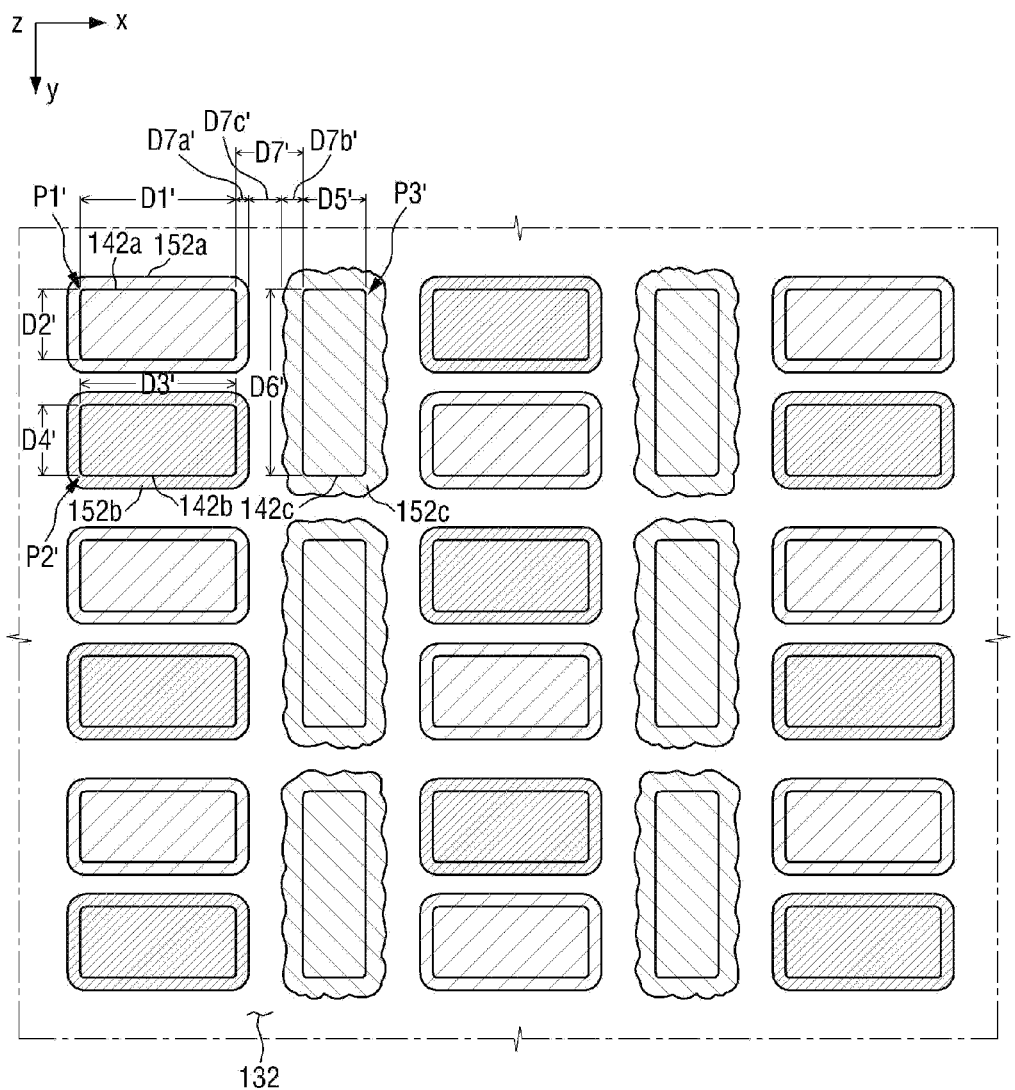
FIG. 21 is a plan view schematically illustrating an arrangement of pixels of an organic luminescence display constructed as another embodiment according to the principles of the present invention.
Figure 22:
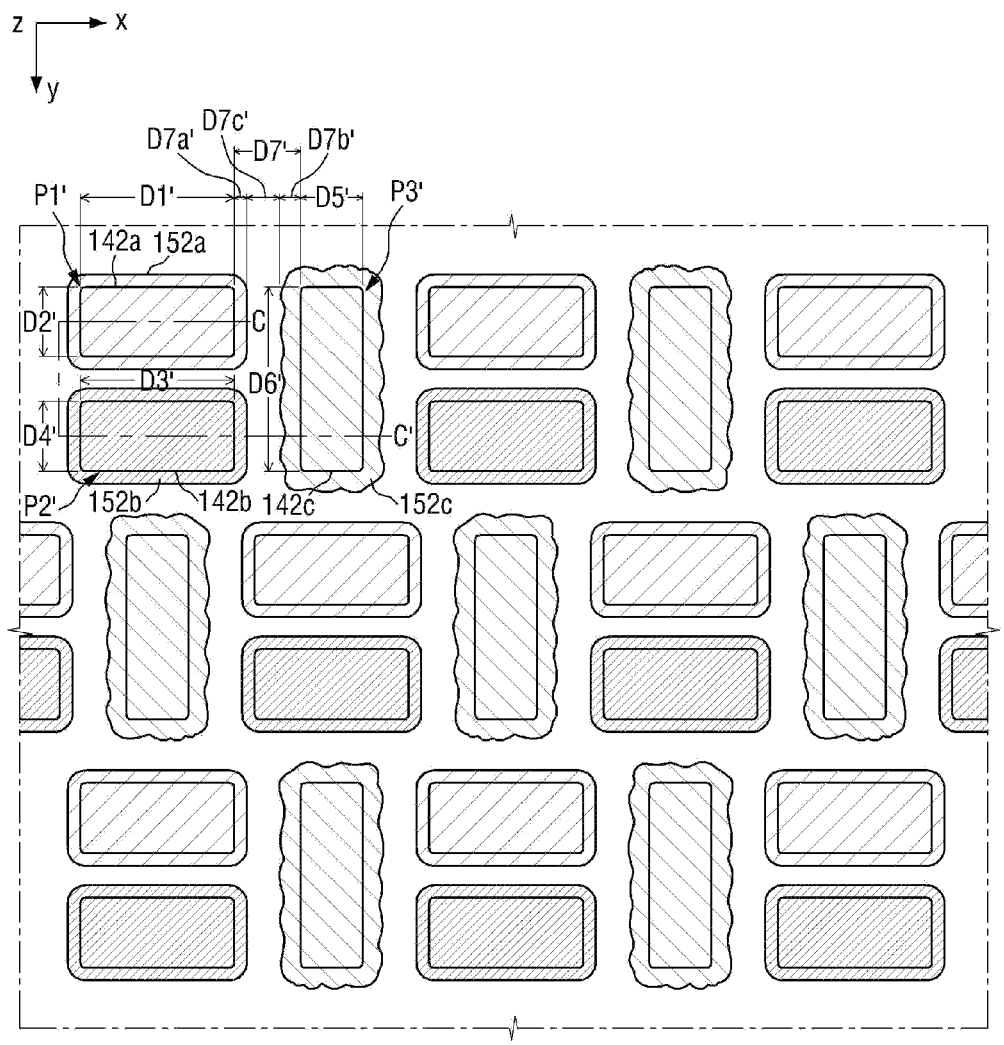
FIG. 22 is a plan view schematically illustrating an arrangement of pixels of an organic luminescence display constructed as another embodiment according to the principles of the present invention.

FIGS. 21 and 22 are plan views schematically illustrating the pixel arrangement of organic luminescence displays according to other embodiments of the present invention. For simplicity, elements substantially identical to those of FIGS. 12 through 13 are indicated by like reference numerals, and thus a repetitive description thereof will be omitted.

Referring to FIG. 21, in the same row, any one of first and second pixels P1' and P2' may be disposed in an $n^{th}$ column, and the other one of the first and second pixels P1' and P2' may be disposed in an $(n+2)^{th}$ column.

Therefore, color reproducibility of the organic luminescence display according to the current embodiment can be improved.

Referring to FIG. 22, first and second pixels P1' and P2' may be surrounded by third pixels P3', and each of the third pixels P3' may be surrounded by the first and second pixels P1' and P2'

In the organic luminescence display according to the current embodiment, a distance between third organic light-emitting layers 152c whose protruding distance is hard to adjust is increased as much as possible. Therefore, the aperture ratio of the organic luminescence display can be improved further.

Embodiments of the present invention provide at least one of the following advantages.

That is, a high-quality organic luminescence display can be manufactured, and unnecessary work loss can be reduced by reducing the process time and cost.

In addition, since a conventional deposition process is still used, high efficiency and stability can be ensured.

Further, the overall aperture ratio of the organic luminescence display can be improved.

However, the effects of the present invention are not restricted to the one set forth herein. The above and other effects of the present invention will become more apparent to one of daily skill in the art to which the present invention pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An organic luminescence display device, comprising:
a substrate; and
a plurality of pixels disposed on the substrate, the pixels comprising:
a plurality of first pixels, each comprising a first organic light-emitting layer; and
a plurality of second pixels which are smaller in size than the first pixels and each of which comprises a second organic light-emitting layer,
surface roughness of the second organic light-emitting layer being greater than surface roughness of the first organic light-emitting layer.

2. The organic luminescence display device of claim 1, wherein the first pixels are dot-shaped, and the second pixels are stripe-shaped.

3. The organic luminescence display device of claim 2, wherein the first and second pixels are quadrangular, a length of long sides of each of the first pixels is equal to a length of long sides of each of the second pixels, and a length of short sides of each of the first pixels is greater than a length of short sides of each of the second pixels.

4. The organic luminescence display device of claim 3, wherein the length of the short sides of each of the first pixels is two to four times the length of the short sides of each of the second pixels.

5. The organic luminescence display device of claim 3, wherein the length of the short sides of each of the second pixels is 1 to 10 μm.

6. The organic luminescence display device of claim 2, wherein a minimum width of each of the first pixels is equal to or greater than a first width, and a minimum width of each of the second pixels is equal to or smaller than a second width which is smaller than the first width.

7. The organic luminescence display device of claim 6, wherein the first width is two to four times the second width.

8. The organic luminescence display device of claim 6, wherein the second width is 1 to 10 μm.

9. The organic luminescence display device of claim 1, wherein the first organic light-emitting layer protrudes out of each of the first pixels, and the second organic light-emitting layer protrudes out of each of the second pixels, wherein a length by which the second organic light-emitting layer protrudes out of each of the second pixels is greater than a length by which the first organic light-emitting layer protrudes out of each of the first pixels.

10. The organic luminescence display device of claim 1, wherein the first organic light-emitting layer comprises an unmarred surface, and the second organic light-emitting layer comprises a surface with random irregularities.

11. The organic luminescence display device of claim 1, wherein the pixels comprise a plurality of third pixels which are equal in size to the first pixels and each of which comprises a third organic light-emitting layer, wherein a surface roughness of the third organic light-emitting layer is equal to the surface roughness of the first organic light-emitting layer.

12. The organic luminescence display device of claim 11, wherein each of the second pixels is disposed between the first and third pixels.

13. The organic luminescence display device of claim 11, wherein the pixels are arranged in a matrix having a plurality of columns and a plurality of rows intersecting the columns, wherein an n-th column comprises the first pixels and the third pixels arranged alternately, an (n+1)-th column adjacent to the n-th column comprises the second pixels, an (n+2)-th column adjacent to the (n+1)-th column comprises the first pixels and the third pixels arranged alternately, and an (n+3)-th column adjacent to the (n+2)-th column comprises the second pixels, wherein, in a same row, any one of the first and third pixels is disposed in the n-th column, and the other one of the first and third pixels is disposed in the (n+2)-th column, where n is a natural number.

14. The organic luminescence display device of claim 13, wherein the second organic light-emitting layer extends continuously over all rows in the (n+1)-th column and the (n+3)-th column.

15. The organic luminescence display device of claim 11, wherein each of the first pixels or each of the third pixels is surrounded by the second pixels, and each of the second pixels is surrounded by the first pixels and the third pixels.

16. The organic luminescence display device of claim 1, wherein each of the first pixels comprises a first pixel electrode which contacts the first organic light-emitting layer, and each of the second pixels comprises a second pixel electrode which contacts the second organic light-emitting layer, wherein the adhesion of the first organic light-emitting layer to the first pixel electrode is greater than the adhesion of the second organic light-emitting layer to the second pixel electrode.

17. An organic luminescence display device, comprising:
a substrate; and
a plurality of pixels disposed on the substrate, the pixels comprising:
a plurality of first pixels, each comprising a first organic light-emitting layer;
a plurality of second pixels, each comprising a second organic light-emitting layer; and
a plurality of third pixels, each comprising a third organic light-emitting layer,
a surface roughness of the first organic light-emitting layer being equal to a surface roughness of the second organic light-emitting layer, and a surface roughness of the third organic light-emitting layer being greater than the surface roughness of the first organic light-emitting layer.

18. The organic luminescence display device of claim 17, wherein the first and second pixels are dot-shaped, and the third pixels are stripe-shaped.

19. The organic luminescence display device of claim 18, wherein the first through third pixels are quadrangular, a length of short sides of each of the first pixels is equal to a length of short sides of each of the second pixels, and a length of short sides of each of the third pixels is smaller than the length of the short sides of each of the first pixels.

20. The organic luminescence display device of claim 19, wherein a length of long sides of each of the third pixels is two to five times the length of the short sides of each of the first pixels.

21. The organic luminescence display device of claim 18, wherein a minimum width of each of the first pixels and a minimum width of each of the second pixels are equal to or greater than a first width, and a minimum width of each of the third pixels is equal to or smaller than a second width which is smaller than the first width.

22. The organic luminescence display device of claim 17, wherein the pixels are arranged in a matrix having a plurality of columns and a plurality of rows intersecting the columns, wherein an n-th column comprises the first pixels and the second pixels arranged alternately, and an (n+1)-th column adjacent to the n-th column comprises the third pixels, wherein each of the third pixels extends continuously over a row in which the first pixels are arranged and a row in which the second pixels adjacent to the first pixels are arranged, where n is a natural number.

23. The organic luminescence display device of claim 22, wherein the third organic light-emitting layer extends continuously over all rows in the (n+1)-th column.

24. The organic luminescence display device of claim 17, wherein the first and second pixels are surrounded by the third pixels, and each of the third pixels is surrounded by the first and second pixels.

* * * * *